(12) United States Patent
Shibusawa

(10) Patent No.: US 10,777,136 B2
(45) Date of Patent: Sep. 15, 2020

(54) DISPLAY DEVICE WITH A LIGHT EMITTING ELEMENT

(71) Applicant: Japan Display Inc., Tokyo (JP)

(72) Inventor: Makoto Shibusawa, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/214,321

(22) Filed: Dec. 10, 2018

(65) Prior Publication Data

US 2019/0197950 A1 Jun. 27, 2019

(30) Foreign Application Priority Data

Dec. 25, 2017 (JP) ................................ 2017-247510

(51) Int. Cl.
| | | |
|---|---|---|
| *G09G 3/3233* | (2016.01) | |
| *G09G 3/3266* | (2016.01) | |
| *H01L 27/32* | (2006.01) | |
| *H01L 27/12* | (2006.01) | |

(52) U.S. Cl.
CPC ......... *G09G 3/3233* (2013.01); *G09G 3/3266* (2013.01); *H01L 27/3248* (2013.01); *H01L 27/3262* (2013.01); *H01L 27/3265* (2013.01); *H01L 27/3276* (2013.01); *G09G 2300/0426* (2013.01); *G09G 2300/0465* (2013.01); *G09G 2300/0809* (2013.01); *G09G 2300/0814* (2013.01); *G09G 2320/0233* (2013.01); *H01L 27/124* (2013.01); *H01L 27/1255* (2013.01)

(58) Field of Classification Search
CPC .......................... G09G 3/3233; G09G 3/3258
See application file for complete search history.

(56) References Cited

U.S. PATENT DOCUMENTS

2006/0028408 A1* 2/2006 Kim ..................... G09G 3/3233
345/76
2010/0013816 A1 1/2010 Kwak

FOREIGN PATENT DOCUMENTS

JP 2010-026488 A 2/2010

* cited by examiner

*Primary Examiner* — Roy P Rabindranath
(74) *Attorney, Agent, or Firm* — Michael Best & Friedrich LLP

(57) ABSTRACT

A display device including a drive transistor, a first capacitor, a first switching element, and a light emitting element, wherein the drive transistor has a first electrode connected to a first node, a second electrode connected to a second node, and a third electrode connected to a third node, one electrode of a first capacitor element is formed from a first conductive layer arranged in the same layer as the second electrode of the drive transistor, and is connected to the first node, another electrode of the first capacitor element is formed from a semiconductor layer arranged in the same layer as an active layer of the drive transistor, and is connected to the second node, the first capacitor element is connected between the first node and the third node, and the light emitting element includes a pixel electrode electrically connected to the third node, and a first common electrode.

12 Claims, 33 Drawing Sheets

DISPLAY DEVICE WITH A LIGHT EMITTING ELEMENT

CROSS REFERENCE TO RELATED APPLICATIONS

This application is based upon and claims the benefit of priority from the prior Japanese Patent Application No. 2017-247510, filed on Dec. 25, 2017, the entire contents of which are incorporated herein by reference.

FIELD

One embodiment of the present invention is related to a display device.

BACKGROUND

An organic electroluminescence (EL) display device (referred to as an EL display device herein) is formed by a plurality of transistors, capacitor elements, and an organic light emitting element (referred to as a light emitting element herein) in each of a plurality of pixels formed above a substrate. Each pixel is driven by a signal which controls a pixel. By performing control of the driving of a transistor included in each pixel by a signal, it is possible to control the current value supplied to a light emitting element, and a display device can display an image. In recent years, demands have been increasing for finely displaying images. That is, there is an increase in demand for high definition display devices. In order to realize high definition, it is necessary to reduce the size of a pixel.

For example, a pixel including seven transistors, two capacitor elements and one light emitting element, and an EL display device including the pixel is disclosed in Japanese Laid Open Patent Application Publication No. 2010-26488.

SUMMARY

One embodiment of the present invention is a display device including a drive transistor having a first electrode connected to a first node, a second electrode connected to a second node, and a third electrode connected to a third node, one electrode of a first capacitor element is formed from a first conductive layer arranged in the same layer as the second electrode of the drive transistor, and is connected to the first node, another electrode of the first capacitor element is formed from a semiconductor layer arranged in the same layer as an active layer of the drive transistor, and is connected to the second node, the first capacitor element is connected between the first node and the third node, and the light emitting element includes a pixel electrode electrically connected to the third node, and a first common electrode.

One embodiment of the present invention is a display device including a drive transistor having a first electrode connected to a first node, a second electrode connected to a second node, and a third electrode connected to a third node, one electrode of a first capacitor element is formed from a first conductive layer arranged in the same layer as the second electrode of the drive transistor, and is connected to the first node, another electrode of the first capacitor element is formed from a semiconductor layer arranged in the same layer as an active layer of the drive transistor, and is connected to the second node, the first capacitor element is connected between the first node and the third node, and the light emitting element includes a pixel electrode electrically connected to the third node, and a first common electrode.

DESCRIPTION OF EMBODIMENTS

Figure 1:
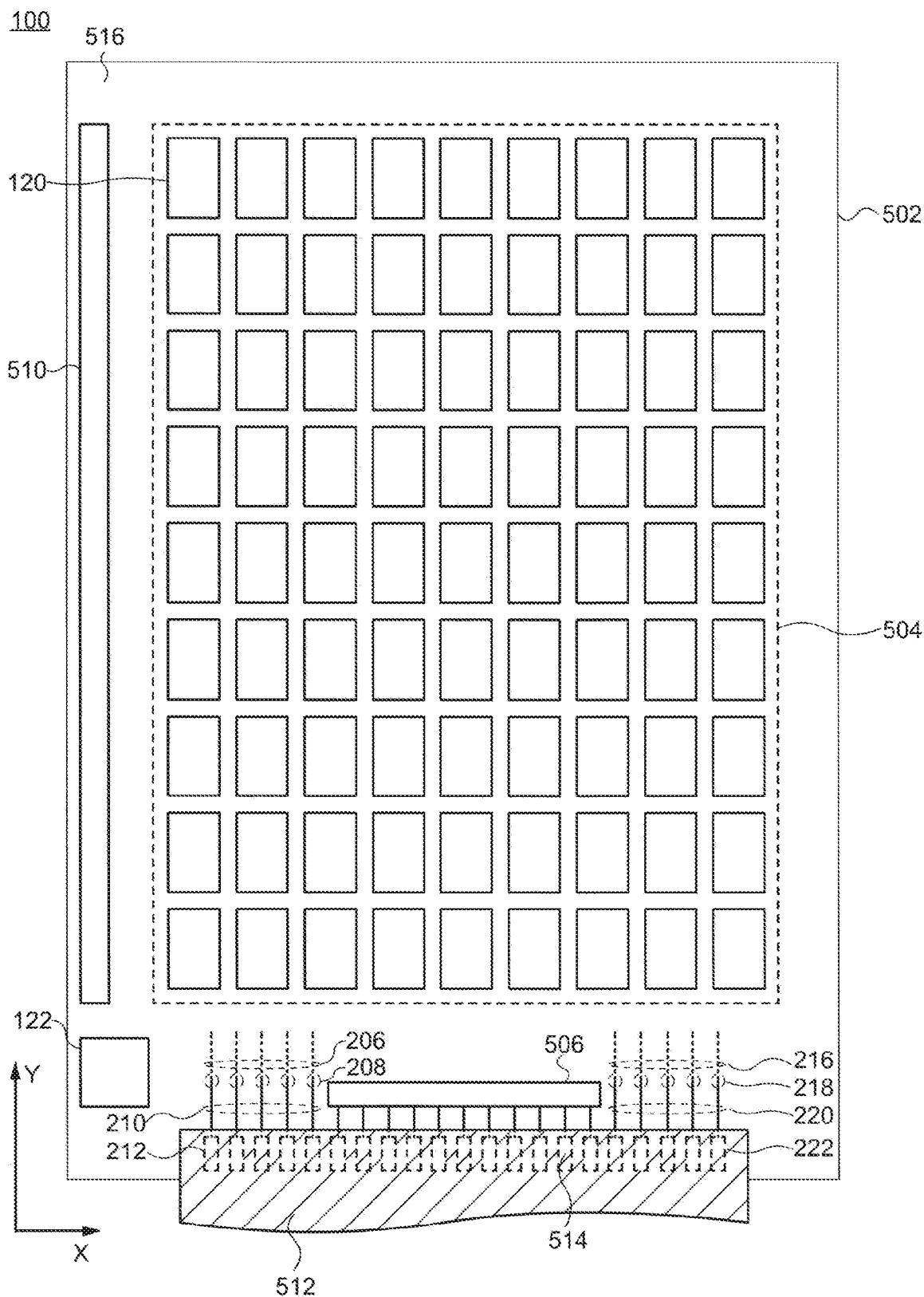
FIG. 1 is a schematic planar diagram of a display device related to one embodiment of the present invention.

The embodiments of the present invention are explained below while referring to the drawings. However, the present invention can be implemented in various modes without departing from the gist of the invention and should not to be interpreted as being limited to the description of the embodiments exemplified below. In addition, although the drawings may be schematically represented in terms of width, thickness, shape, and the like of each part as compared with their actual mode in order to make explanation clearer, it is only an example and an interpretation of the present invention is not limited. Furthermore, in the present specification and each drawing, the same reference symbols (or symbols such as a, b attached after a numeral) are attached to the same elements as those described with reference to preceding figures and a detailed explanation may be omitted accordingly. Furthermore, the characters "first", "second" denoted to each element are signs of convenience used for distinguishing each element and do not have any further meaning unless otherwise specified.

In the present specification, when a certain member or region is "above (or below)" another member or region, unless otherwise noted this includes not only the case of being directly above (or directly below] another member or region, but also the case of being further above (or further below] another member or region, that is, this also includes the case of above or below another member or region with a separate structural element included therebetween. Furthermore, in the explanation below, unless otherwise stated, a side on which a first film is arranged with respect to a substrate is referred to as "above" or "upper" in a cross-sectional view, and the reverse is explained as "below" or [lower].

A first substrate explained in the present specification has at least one planar shaped main surface, and each layer such as an insulating layer, a semiconductor layer and a conductive layer, or each element such as a transistor and a display element are arranged on this main surface. In the explanation below, in the case where an explanation is made on the basis of one main surface of the first substrate as "upper", "upper layer", "above" or "upper surface" with respect to the first substrate in a cross-sectional view, unless otherwise specified, such an explanation is made with reference to the main surface of the first substrate.

In the pixel disclosed in Japanese Laid Open Patent Application Publication No. 2010-26488, the dynamic range of an image signal and the dynamic range of a voltage (referred to as Vos herein) between a gate electrode and a source electrode of a drive transistor are the same. Generally, the channel length of a drive transistor is increased in order to supply a current with less variation to a light emitting element. However, since the size of a pixel is reduced when providing an EL display device with high definition, it becomes difficult to increase the channel length of the drive transistor. As a result, the current supply capability of the drive transistor is increased and the dynamic range of Vgs of the drive transistor is narrowed. Consequently, the dynamic range of the image signal becomes narrow. Therefore, when a person views the display of an EL display device, luminosity unevenness due to variation of an image signal becomes easily recognizable.

In view of such a problem, one embodiment of the present invention is to provide a display device having an image signal with a wide dynamic range.

1. Background of the Invention

The inventors have examined an EL display device with pixels having an image signal with wide dynamic range. Generally, in an EL display device, each of a plurality of pixels formed on a substrate is formed by a drive transistor, a capacitor element, a light emitting element and an additional capacitor included in the light emitting element. The additional capacitor included in the light emitting element includes, for example, a case where the light emitting element itself which has diode characteristics also includes a capacitor component. An image signal is supplied to the drive transistor according to a signal for driving each pixel. The drive transistor supplies a current to the light emitting element according to the image signal supplied to the drive transistor. In addition, it is possible for the display device to display an image when the light emitting element emits light. In a pixel including a drive transistor in which a first electrode is connected to a first node, a second electrode is connected to a second node and a third electrode is connected to a third node, the inventors attempted to intentionally arrange a capacitor element (Csx) between one of the first node and the second node or between the first node and the third node. Although details are explained using FIG. 3, the inventors found that by adopting this structure, it is possible to make the dynamic range of an image signal wider than the dynamic range of the drive transistor.

2. First Embodiment

In the present embodiment, a display device according to one embodiment of the present invention is explained. Furthermore, in the present specification, the display device is explained as an active matrix type EL display device.

2-1. Overall Structure

FIG. 1 is a schematic planar diagram of a display device according to one embodiment of the present invention. The display device 100 includes a substrate 502, a display region 504, an image signal line drive circuit 506, a scanning signal line drive circuit 510, a control circuit 122, a terminal electrode 514 and a periphery region 516. The display region 504, the image signal line drive circuit 506, the scanning signal line drive circuit 510, the control circuit 122, the terminal electrode 514 and the periphery region 516 are arranged on the upper surface of the substrate 502. The display region 504 has a pixel 120 for displaying images on the display device 100. The pixel 120 includes a transistor. It is possible to display an image on the display device 100 by driving the transistor.

Figure 2:
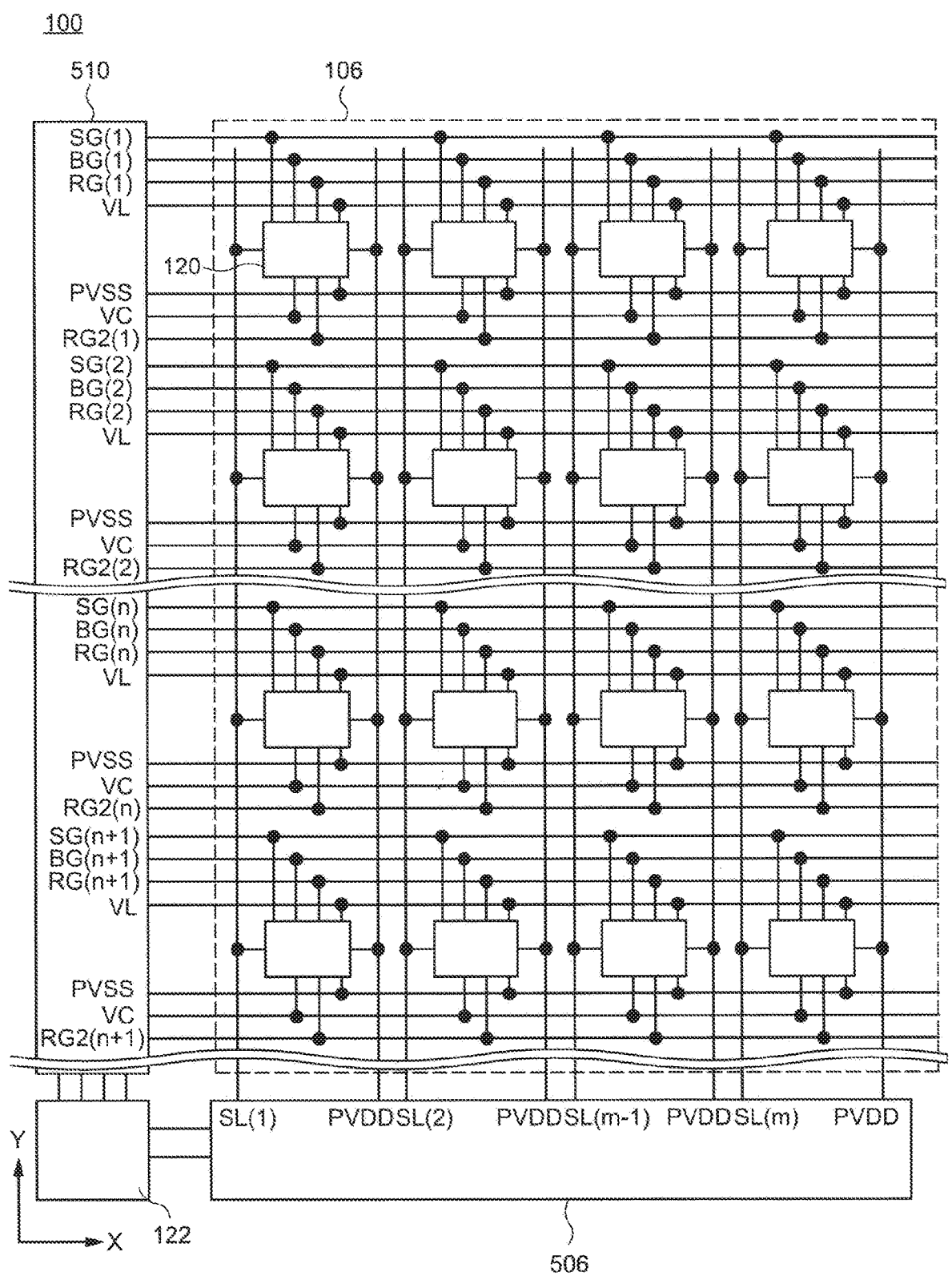
FIG. 2 is a schematic planar diagram of a display device related to one embodiment of the present invention.

A scanning signal line drive circuit 510 and an image signal line drive circuit 506 for controlling driving of the pixel 120 are arranged outside of the display region 504. An example is shown in FIG. 1 in which the image signal line drive circuit 506 uses an IC chip. In addition, although an example in which the scanning signal line drive circuit 510 and the image signal line drive circuit 506 are arranged on the upper surface of the substrate 502 is shown in FIG. 2, the present invention is not limited to this example. For example, a drive circuit formed on a substrate (semiconductor substrate or the like) which is different from the substrate 502 may be arranged above a connector 512 such as the substrate 502 or a flexible printed circuit (FPC) substrate. In addition, a part or all of the circuits included in the scanning signal line drive circuit 510 and the image signal line drive circuit 506 may be formed above a substrate which is different from the substrate 502 and may be arranged above the substrate 502 and the connector 512. In addition, a drive circuit or a part of a drive circuit included in the image signal line drive circuit 506 may be formed directly on the substrate 502. Furthermore, although omitted from FIG. 1, display elements such as a light emitting element arranged in a pixel 120 and various semiconductor elements for controlling the display element are formed on the upper surface of the substrate 502.

The display device 100 also includes a first wiring 206, contact hole 208, first terminal wiring 210, first terminal 212, second wiring 216, contact hole 218, second terminal wiring 220 and a second terminal 222. Similar to the scanning signal line drive circuit 510, these are also arranged on the upper surface of the substrate 502.

Although omitted from FIG. 1, for example, an image signal line for supplying an image signal to each pixel 120, a power supply line for supplying power to each pixel 120, a scanning signal line drive circuit 510 and a control circuit 122 are electrically connected to the first wiring 206 which extends from the outside of the display region 504. The first wiring 206 extends outside the display region 504 and is electrically connected to the first terminal wiring 210 via the contact hole 208. The first terminal wiring 210 is exposed in the vicinity of an end part of the display device 100 and forms the first terminal 212. The first terminal 212 is connected to the connector 512.

Although omitted from FIG. 1, for example, an image signal line for supplying an image signal to each pixel 120, a power supply line for supplying power to each pixel 120, a scanning signal line drive circuit 510 and a control circuit 122 are similarly, electrically connected to the second wiring 216 which extends from the outside of the display region 504. The second wiring 216 extends outside of the display region 504 and is electrically connected to the second terminal wiring 220 via the contact hole 218. The second terminal wiring 220 is exposed is the vicinity of the end part of the display device 100 and forms the second terminal 222. The second terminal 222 is connected to the connector 512. Furthermore, the second wiring 216 may also be the first wiring 206. The contact hole 218 may also be the contact hole 208. The second terminal wiring 220 may also be the first terminal wiring 210. The second terminal 222 may also be the first terminal 210. The second terminal 222 may also be the first terminal 212.

Supply of signals to the pixel 120 is performed from an external circuit (not shown in the diagram) via the first terminal 212, the scanning signal line drive circuit 510 and the image signal line drive circuit 506. The first terminal 212 can be formed to be aligned along one side of the display device 100. In this way, it is possible to independently supply a voltage or signal respectively to the display region 504 by using a single connector 512.

The arrangement of the pixels 120 is shown as a stripe arrangement. Each of the pixels 120 may correspond to, for example, three sub-pixels 130, a sub-pixel 132 and a sub-pixel 134 (described herein using FIG. 33). One pixel 102 (described herein in FIG. 33) may be formed by three sub-pixels. Each sub-pixel is arranged with one display element such as a light emitting element. The color corresponding to a sub-pixel is determined according to the characteristics of the light emitting element or a color filter which is arranged on the sub-pixel. In the present specification, each of the pixels 120 includes one light emitting element, and at least one of the pixels 120 has a plurality of sub-pixels supplying different colors. In addition, the pixel 120 is a minimum unit which forms a part of an image which is reproduced in the display region 504. The sub-pixel included in the display region 504 is included in any one of the pixels.

In addition, it is possible to configure a stripe arrangement so that three sub-pixels 130, a sub-pixel 132 and a sub-pixel 134 supply different colors. For example, the sub-pixel 130, the sub-pixel 132 and the sub-pixel 134 may be provided with a light emitting layer which emits the three primary colors of red, green and blue respectively. In addition, by supplying an arbitrary voltage or current to each of the three subpixels, it is possible to provide a full color display device. Furthermore, there is no limitation to the arrangement of the pixels 120, and a delta array or a pentile array and the like can be adopted.

FIG. 2 is a schematic planar diagram of the display device 100 according to one embodiment of the invention. An image signal, a timing signal for controlling the operation of a circuit and a power supply and the like are supplied to the control circuit 122 via the plurality of terminal electrodes 514 shown in FIG. 1. The control circuit 122 supplies each signal and power supply voltage to the scanning signal line drive circuit 510 and the image signal line drive circuit 506. The control circuit 122 generates a new signal or power supply voltage from each signal or power supply voltage using a logic circuit (not shown in the diagram) or a voltage generation circuit (not shown in the diagram) which are included in the control circuit 122, and may supply these to the scanning signal line drive circuit 510 and the image signal line drive circuit 506. The position where the control circuit 122 is arranged is not limited to above the substrate 502 shown in FIG. 1. For example, the control circuit 122 may be positioned on the connector 512 which is connected to the terminal electrode 514.

The scanning signal line drive circuit 510 and the image signal line drive circuit 506 drive a light emitting element included in the pixel 120 using each signal and power supply voltage supplied from the control circuit 122 which makes the light emitting element emit light and thereby play the role of displaying an image in the display region 504.

The scanning signal line drive circuit 510 is formed to supply a scanning signal SG(n) in common to a plurality of pixels 120 located on the nth row formed within the display region 504. The scanning signal line drive circuit 510 is formed to supply reset control signals RG(n) and RG2(*n*) in common to a plurality of pixels 120 located on the nth row formed within the display region 504. The scanning signal line drive circuit 510 is formed to supply a light emission control signal BG(n) in common to a plurality of pixels 120 located on the nth row formed within the display region 504. The scanning signal line drive circuit 510 is formed to supply a reset signal VL to a plurality of pixels. Here, the potential of the reset signal VL is denoted as Vrst. Vrst may also be referred to as a reset potential. The scanning signal line drive circuit 510 is further formed to supply a capacitance signal VC to a plurality of pixels. The potential of the capacitance signal VC is denoted as Vcs. Furthermore, although an example is shown in which Vcs is a fixed potential in the present specification, Vcs may vary with time. Furthermore, although an example in which the scanning signal line drive circuit 510 supplies the reset signal VL to a plurality of pixels is shown in FIG. 2, the present invention is not limited to this example. The image signal line drive circuit 506 may also supply the reset signal VL to a plurality of pixels. Similarly, the image signal line drive circuit 506 may also supply the capacitance signal VC to a plurality of pixels. In addition, the reset signal VL may also be collectively supplied to all the pixels from the terminal electrode 514. Similarly, the capacitance signal VC may be collectively supplied to all the pixels from the terminal electrode 514.

The image signal line drive circuit 506 is formed to supply an image signal SL(m) in common to the plurality of pixels 120 located on the mth column formed within the display region 504. The potential of the image signal is denoted as Vsig(m) herein. The image signal is determined according to image data displayed in the display region 504 and Vsig(m) is adjusted by a correction method described later.

2-2. Pixel

Figure 3:
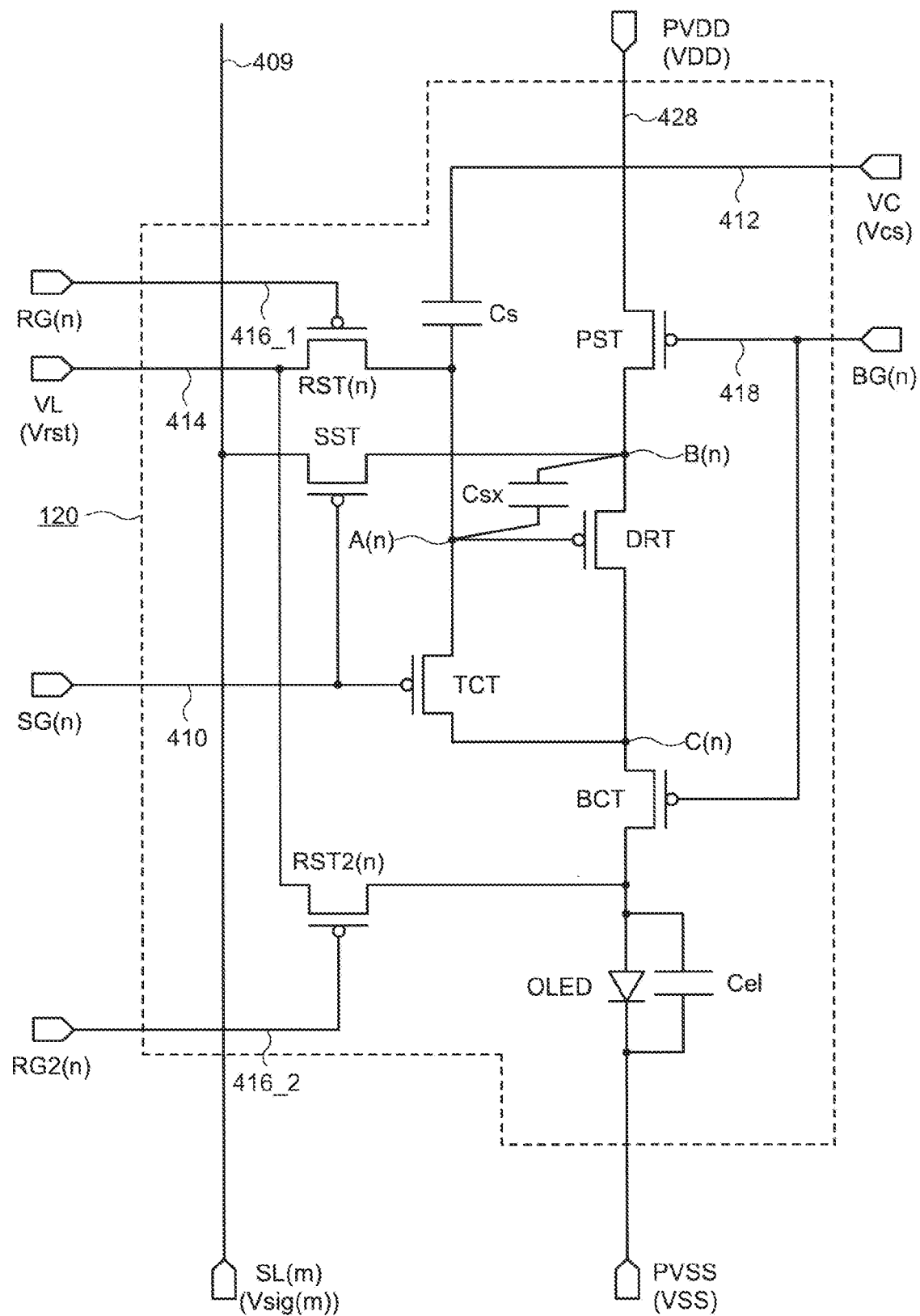
FIG. 3 is a circuit diagram of a pixel included in a display device related to one embodiment of the present invention.

FIG. 3 is a circuit diagram of a pixel 120 according to one embodiment of the present invention. A circuit diagram of the pixel 120 of n rows and m columns shown in FIG. 2 is shown. The pixel 120 may also be a sub-pixel.

Each transistor shown in FIG. 3 can have a group 14 element such as silicon or germanium or an oxide which exhibits semiconductor characteristics in a channel region. In the present embodiment, although all of these transistors are described as p-channel type field effect transistors, only some of these may be p-channel type field effect transistors. Furthermore, the channel region of these transistors can have various morphologies selected from single crystal, polycrystalline, microcrystalline or amorphous. For example, low temperature polysilicon (LTPS) which is obtained by melting and recrystallizing amorphous silicon at a relatively low temperature can be given.

As is shown in FIG. 3, the pixel 120 includes a drive transistor DRT, a correction transistor TCT (first switch), a selection transistor SST (second switch), a first reset transistor RST (third switch), a power supply transistor PST (fourth switch), a light emission control transistor BCT (fifth switch), a second reset transistor RST2 (sixth switch), an auxiliary capacitor element (first capacitor element) Csx, a storage capacitor element (second capacitor element) Cs, a light emitting element OLED and an additional capacitor Cel. Each of these transistors includes a first electrode (gate electrode) and a pair of terminals (source electrode, drain electrode) comprised from a second electrode and a third electrode. The auxiliary capacitor element Csx includes a pair of terminals (first terminal, second terminal). The storage capacitor element Cs includes a pair of terminals (first terminal, second terminal). The additional capacitor Cel includes a pair of terminals (first terminal, second terminal). The pairs of terminals described above are also referred to as a pair of electrodes. Furthermore, although FIG. 3 shows an example in which the additional capacitor Cel is arranged in parallel with the light emitting element OLED, the present invention is not limited to this structure. The additional capacitor Cel may be a parasitic capacitor of the light emitting element OLED or may include a capacitor element arranged in parallel with the light emitting element OLED and a parasitic capacitor of the light emitting element OLED. A high potential VDD is supplied from the drive power supply line PVDD and a reference potential VSS is supplied from a reference potential line PVSS as a power supply for driving the light emitting element OLED. The potential Vcs of the capacitor signal VC can be made substantially the same as the high potential VDD which is supplied from the drive power supply line PVDD. Furthermore, the potential Vrst of the reset signal VL is smaller than the high potential VDD which is supplied from the drive power supply line PVDD and the potential Vcs of the capacitor signal VC, and can be made substantially the same as the reference potential VSS.

The drive transistor DRT has the role of making a current flow to the light emitting element OLED based on an input image signal and to make the light emitting element OLED emit light. A correction transistor TCT has the role of conducting electricity between the gate electrode and the drain electrode of the drive transistor DRT when correcting a threshold value of the drive transistor DRT. The selection transistor SST has the role of supplying an image signal to the drive transistor DRT. The first reset transistor RST has the role of supplying Vrst to the gate electrode of the drive transistor DRT and resetting the gate of the drive transistor DRT. The power supply transistor PST controls connection and disconnection between the drive power supply line PVDD and the drive transistor DRT. The light emission control transistor BCT controls connection and disconnection between the drive transistor DRT and the light emitting element OLED and between the drive transistor DRT and the additional capacitor Cel. That is, the light emission control transistor BCT has the role of controlling light emission and non-light emission of the light emitting element OLED. The second reset transistor RST2 has the role of supplying Vrst to the first terminal of the light emitting element OLED and resetting the source of the drive transistor DRT and the light emitting element OLED. A first terminal of the light emitting element OLED is a pixel electrode. In addition, the storage capacitor element Cs has the role of storing a gate potential of the drive transistor DRT. That is, the storage capacitor element Cs has the role of storing an input image signal, specifically, maintaining a gradation level of the input image signal. The light emitting element OLED has diode characteristics. In addition, the light emitting element OLED includes a pixel electrode, the common electrode described above, and a light emitting layer (functional layer, an organic layer) which is positioned between the pixel electrode and the common electrode. The additional capacitor Cel is a capacitor included in the light emitting element OLED. In one embodiment of the present invention, an input image signal may be stored by the additional capacitor Cel and the capacitor Cs.

The auxiliary capacitor element Csx is arranged between a node A(n) connected to the gate electrode of the drive transistor DRT and a node B(n) connected to the source electrode of the drive transistor DRT. In the display device according to one embodiment of the present invention, by arranging the auxiliary capacitor element Csx, it is possible to adjust the ratio between the change amount of Vgs of the drive transistor DRT and the amplitude of the potential Vsig(m) of an image signal. Specifically, Vgs is as shown in equation 1 below. Here, Vgs is a potential between the gate electrode and the source electrode of the drive transistor DRT. Csv is the capacitance value of the storage capacitor element Cs. Csxv is a capacitance value of the auxiliary capacitor element Csx. Vsig(m) is the potential of an image signal. VDD_V is the potential of the drive power supply line PVDD. Vth is the threshold voltage of the drive transistor.

$$Vgs = \frac{Csv}{(Csv + Csxv)} \times (Vsig(m) - \text{VDD\_V}) - Vth \qquad (1)$$

Equation 1 shows that the change amount of Vgs of the drive transistor DRT can be calculated by compressing the amplitude of an image signal Vsig by the ratio of Csv and Csxv. Equation 1 shows that the amplitude of the image signal Vsig, that is, the effect of enlarging the dynamic range can be calculated. For example, assuming Csxv is 5 fF, the capacitance value of 5 fF is the same value as the parasitic capacitance. In Equation 1, for example, it is assumed that Csv is 100 fF and Csxv is 5 fF. In this case, the dynamic range of the potential Vsig(m) of the image signal can only be improved by 5% compared to the change amount of Vgs of the drive transistor DRT. However, in the case when Csxv is set to 30 fF, the dynamic range of the potential Vsig(m) of the image signal can be improved up to about 25%. That is, in the display device, the auxiliary capacitor element Csx is intentionally arranged between the node A(n) which is connected to the gate electrode of the drive transistor and the node B(n) which is connected to the source electrode of the drive transistor, thereby it is possible to widen the dynamic range of the image signal. In addition, when the light emitting element OLED emits light, the auxiliary capacitor element Csx can function as a storage capacitor element similar to the storage capacitor element Cs. Therefore, by arranging the auxiliary capacitor element Csx in the display device, the storage characteristics of a pixel 120 can be improved. In addition, by arranging the auxiliary capacitor element Csx in the display device, it is possible to distribute the capacitance value necessary for the display device to store image data to the storage capacitor element Cs and the auxiliary capacitor element Cs. Therefore, by arranging the auxiliary capacitor element Csx in the display device, it is possible to improve the degree of freedom of a pixel layout and the degree of freedom of the design of a pixel circuit. Furthermore, the capacitance value Csxv of the auxiliary capacitor element Csx is smaller than the capacitance value Csv of the storage capacitor Cs. Preferably, the capacitance value Csxv of the auxiliary capacitor element Csx is 30% or more and 50% or less of the capacitance value Csv of the storage capacitor Cs.

The gate electrode of the first reset transistor RST(n) is electrically connected to a reset control line 416_1. A reset control signal RG(n) is supplied to the reset control line 416_1. The conduction state and non-conducting state of the first reset transistor RST(n) are controlled by the signal supplied to the reset control signal RG(n). When the signal supplied to the reset control signal RG(n) is low level, the first reset transistor RST(n) is in a conducting state. When the signal supplied to the reset control signal RG(n) is high level, the first reset transistor RST(n) is in a non-conducting state. The source electrode of the first reset transistor RST is electrically connected to a reset potential line 414. A reset signal VL is supplied to the reset potential line 414. The drain electrode of the first reset transistor RST is electrically connected to the gate electrode of the drive transistor DRT, the source electrode of the correction transistor TCT, the first terminal of the auxiliary capacitor element Csx and the first terminal of the storage capacitor element Cs. The second terminal of the storage capacitor element Cs is electrically connected to a capacitor line 412. A capacitance signal VC is supplied to the capacitor line 412.

The gate electrode of the selection transistor SST and the gate electrode of the correction transistor TCT are electrically connected to the scanning signal line 410. A scanning signal SG(n) is supplied to the scanning signal line. A conductive state and non-conductive state of the selection transistor SST and the correction transistor TCT are controlled by a signal supplied to the scanning signal SG(n). When the signal supplied to the scanning signal SG(n) is low level, the selecting transistor SST and the correcting transistor TCT are in a conducting state. When the signal supplied to the scanning signal SG(n) is high level, the selection transistor SST and the correction transistor TCT are in a non-conducting state. The source electrode of the selection transistor SST is electrically connected to an image signal line 409. An image signal SL(m) is supplied to the image signal line 409. The drain electrode of the selection transistor SST is electrically connected to the drain electrode of the power supply transistor PST, the source electrode of the drive transistor DRT and the second terminal of the auxiliary capacitor element Csx. The source electrode of the power transistor PST is electrically connected to the drive power supply line PVDD. The drive power supply line PVDD is a drive power supply line 428.

The gate electrode of the power supply transistor PST and the gate electrode of the light emitting control transistor BCT are electrically connected to a light emitting control line 418. A light emitting control signal BG(n) is supplied to the light emitting control line 418. The conductive state or non-conductive state of the power supply transistor PST and the light emitting control transistor BCT are controlled by a signal supplied to the light emitting control signal BG(n). When the signal supplied to the light emitting control signal BG(n) is low level, the power supply transistor PST and the light emitting control transistor BCT are in a conductive state. When the signal supplied to the light emitting control signal BG(n) is high level, the power supply transistor PST and the light emitting control transistor BCT are in a non-conductive state. The drain electrode of the drive transistor DRT is electrically connected to the drain electrode of the correction transistor TCT and the source electrode of the light emitting control transistor BCT. The drain electrode of the light emitting control transistor BCT is electrically connected to the drain electrode of the second reset transistor RST2, the first terminal of the light emitting element OLED and the first terminal of the additional capacitor Cel.

The gate electrode of the second reset transistor RST2(n) is electrically connected to a reset control line 416_2. A reset control signal RG2(n) is supplied to the reset control line 416_2. The conduction state and the non-conducting state of the second reset transistor RST2(n) are controlled by the signal supplied to the reset control signal RG2(n). When the signal supplied to the reset control signal RG2(n) is low level, the second reset transistor RST2(n) is in a conducting state. When the signal supplied to the reset control signal RG2(n) is high level, the second reset transistor RST2(n) is in a non-conducting state.

The second terminal of the light emitting element OLED and the second terminal of the additional capacitor Cel are electrically connected to a reference potential line PVSS.

The drain electrode of the first reset transistor RST, the gate electrode of the drive transistor DRT, the source electrode of the correction transistor TCT, the first terminal of the auxiliary capacitor element Csx and the first terminal of the storage capacitor element Cs are connected to the first node A(n). The drain electrode of the selection transistor SST, the drain electrode of the power supply transistor PST, the source electrode of the drive transistor DRT, and the second terminal of the auxiliary capacitor element Csx are electrically connected to the second node B(n). The drain electrode of the drive transistor DRT, the drain electrode of the correction transistor TCT and the source electrode of the light emitting control transistor BCT are electrically connected to a third node C(n).

Since the capacitor line 412 supplies a potential Vcs common to each pixel, it is sometimes called a "second common electrode" in the present specification. Since the reset potential line 414 supplies a potential Vrst common to each pixel, it is sometimes called a "third common electrode" in the present specification.

In the present specification, a conducting state is a state in which a source electrode and a drain electrode of a transistor are electrically conducting, a state in which a current flows to the transistor, a state in which the transistor is ON, and a state in which a switch is ON. In addition, in the present specification, a non-conductive state is a state in which a source electrode and a drain electrode of a transistor are electrically non-conducting, a state in which no current flows to the transistor, a state in which the transistor is OFF, and a state in which a switch is OFF. Furthermore, a person skilled in the art could easily understand that a small current flows such as a leakage current even in a state in which no current flows to the transistor or the switch or in an OFF state.

2-3. Stacked Structure

A schematic layout of pixels included in a display device according to one embodiment of the present invention and a stacked structure of pixels included in a display device according to one embodiment of the present invention are explained using FIG. 4 to FIG. 17. Furthermore, an explanation similar to the content explained in FIG. 1 to FIG. 3 may be omitted in the explanation using FIG. 4 to FIG. 17.

Figure 4:
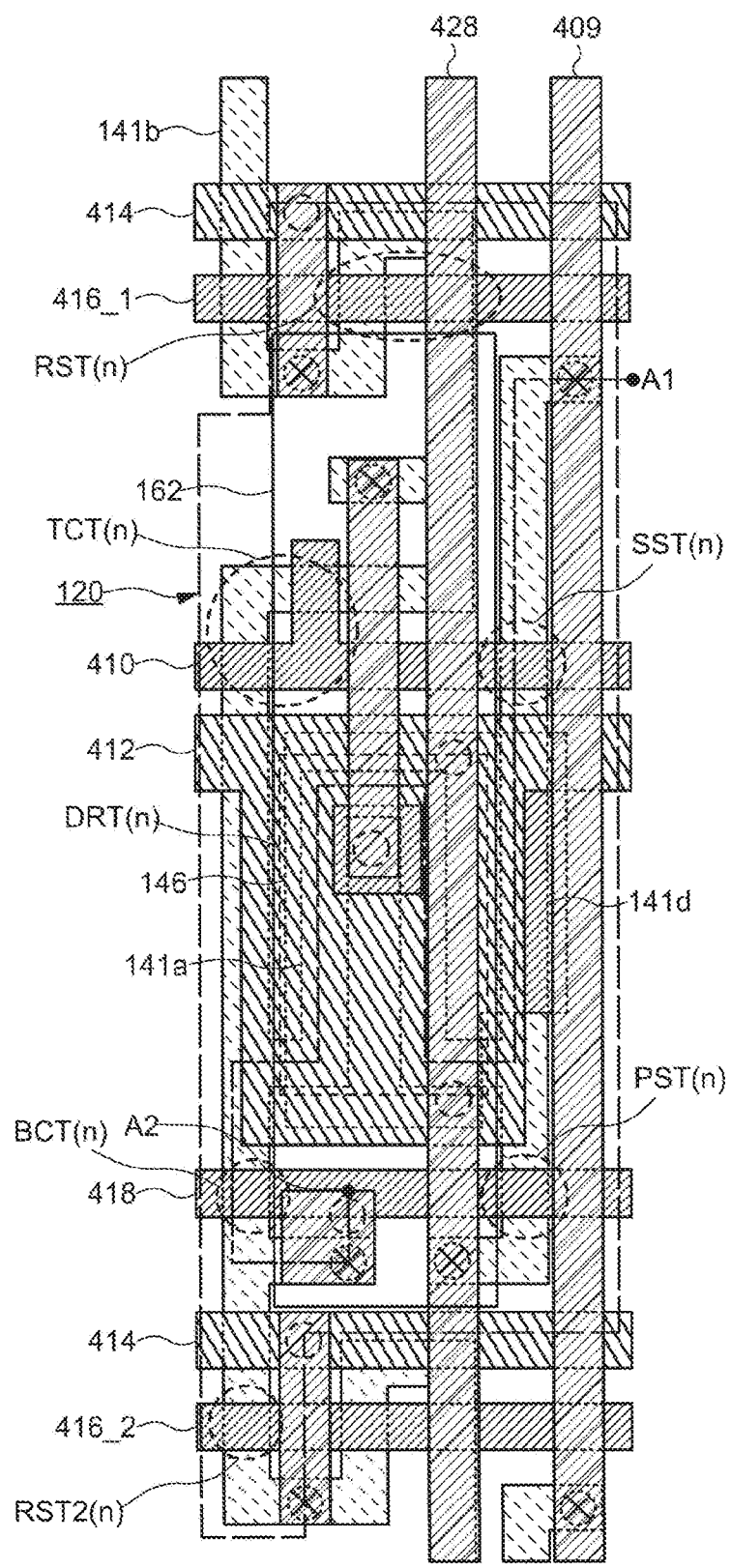
FIG. 4 is a schematic layout of a pixel included in a display device related to one embodiment of the present invention.
Figure 5:
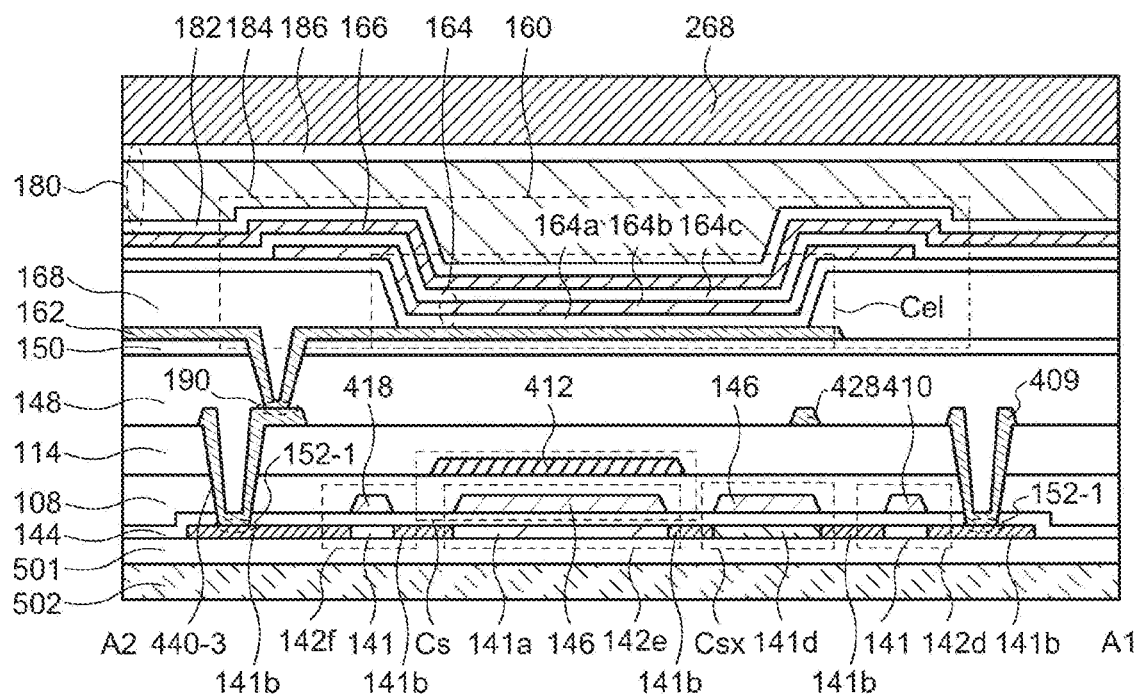
FIG. 5 is a schematic cross-sectional diagram along the line A1-A2 of the pixel shown in FIG. 4.

FIG. 4 is a schematic layout of pixels included in a display device according to one embodiment of the present invention. FIG. 5 is a schematic cross-sectional diagram along the line A1-A2 of the pixel shown in FIG. 4. Details similar to the detail explained in FIG. 1 to FIG. 3 are omitted. In FIG. 4, symbols attached to parts enclosed by a dotted line frame correspond to the symbols indicating each transistor shown in FIG. 3.

Figure 6:
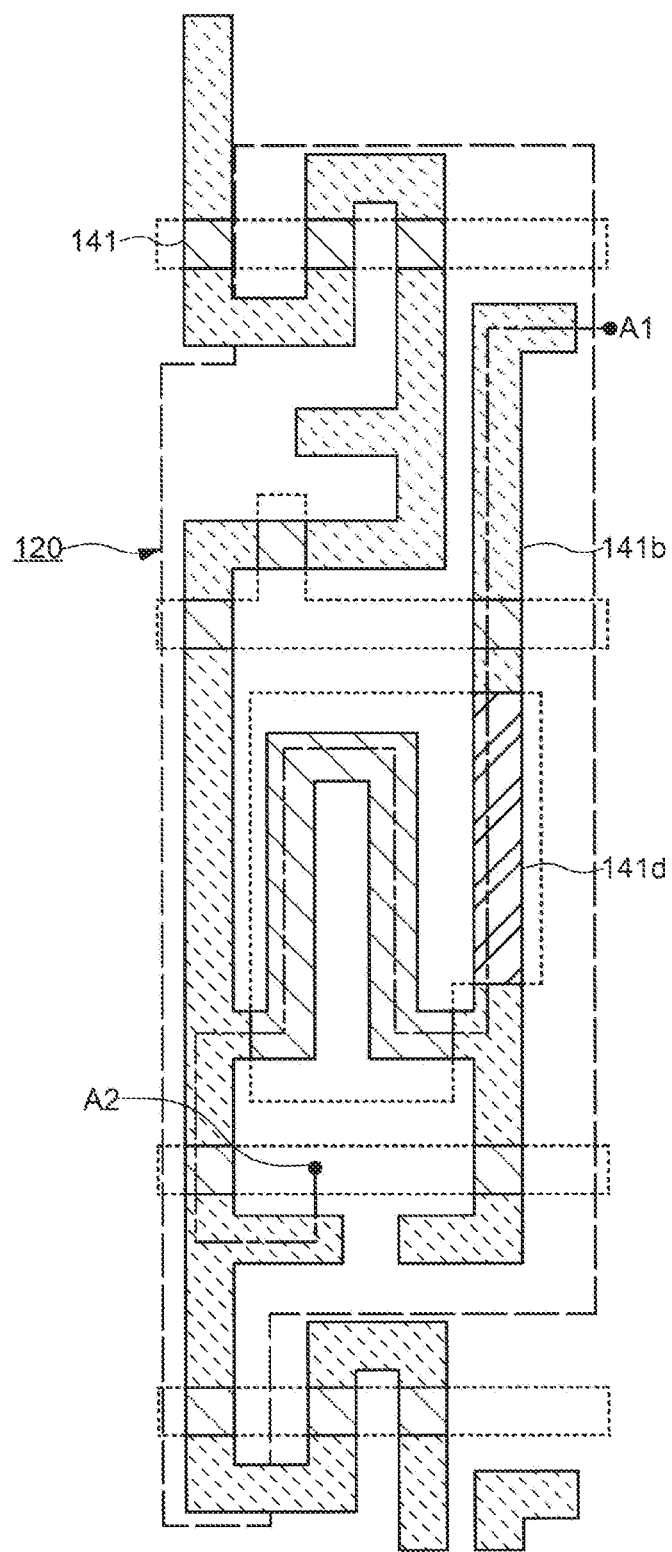
FIG. 6 is a schematic layout of a pixel included in a display device related to one embodiment of the present invention.
Figure 7:
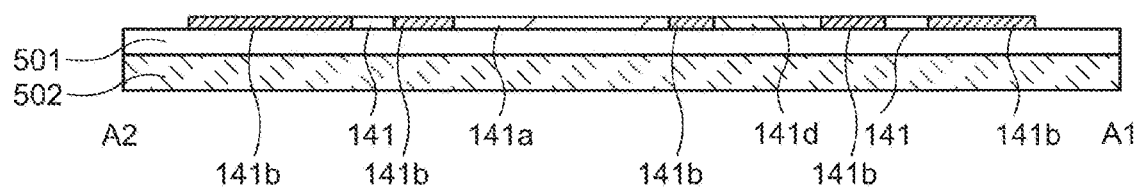
FIG. 7 is a schematic cross-sectional diagram along the line A1-A2 of the pixel shown in FIG. 6.

FIG. 6 is a part of a schematic layout of pixels included in a display device according to one embodiment of the present invention. FIG. 7 is a schematic cross-sectional diagram along the line A1-A2 of the pixel shown in FIG. 6. FIG. 6 and FIG. 7 show a state in which a semiconductor layer is arranged in the process of forming a pixel. Referring to FIG. 4 to FIG. 7, the display device 100 is arranged with a semiconductor layer 141 on the upper surface of a substrate 502 interposed by a base film 501 having an arbitrary structure. Impurities such as boron or phosphorus are injected into the semiconductor layer 141 with the gate electrode formed later as a mask in order to reduce the resistance of a region 141b which does not overlap the gate electrode. On the other hand, although a region 141d in which the auxiliary capacitor element Csx is formed later is included in a region where the semiconductor layer 141 and the gate electrode overlap, impurities such as boron and phosphorus are injected in advance before forming the gate electrode in order to function as a capacitor instead of a transistor.

Figure 8:
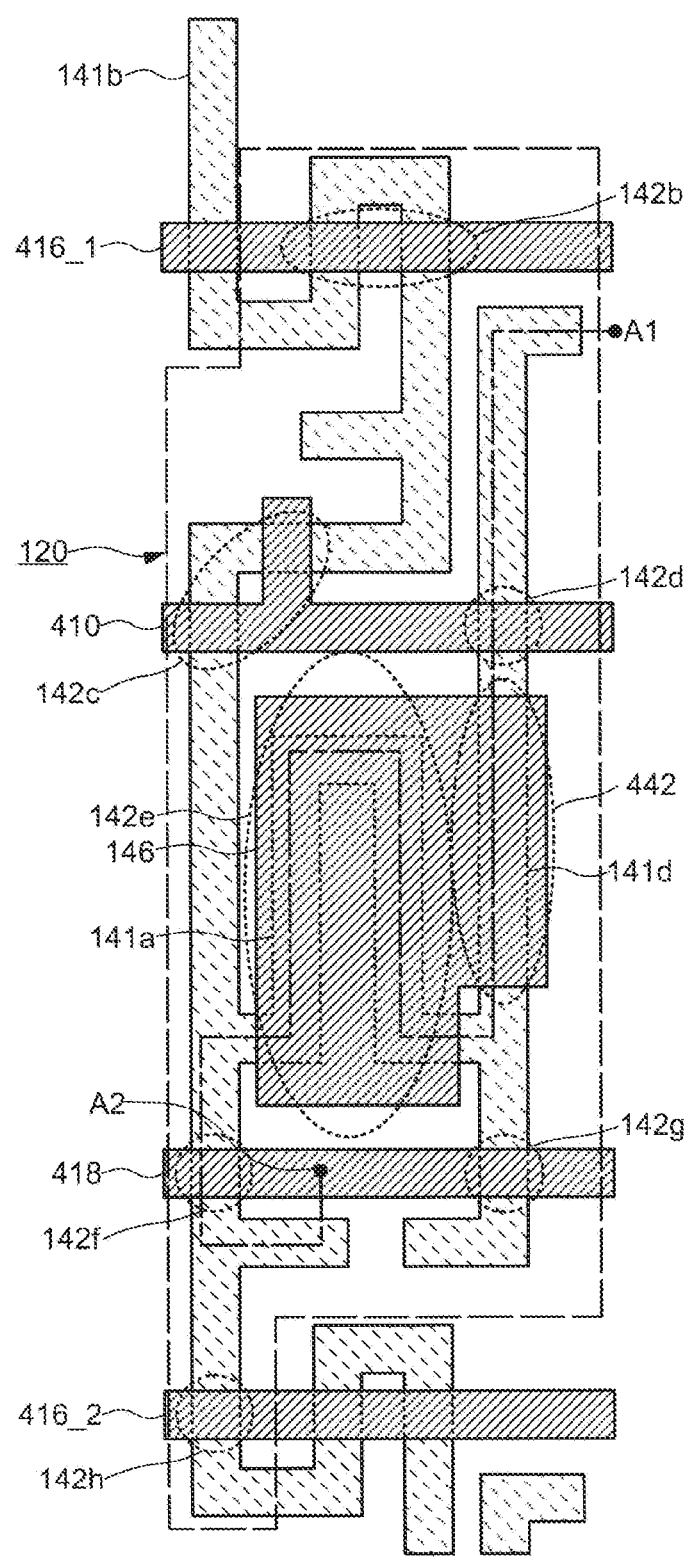
FIG. 8 is a schematic layout of a pixel included in a display device related to one embodiment of the present invention.
Figure 9:
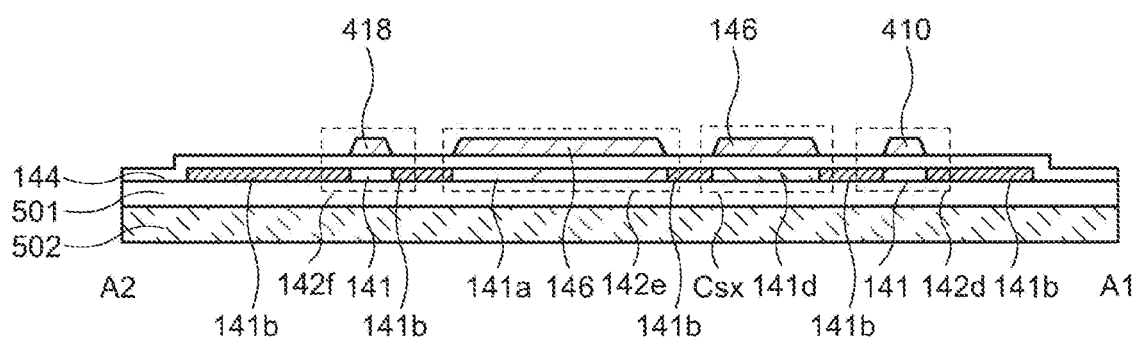
FIG. 9 is a schematic cross-sectional diagram along the line A1-A2 of the pixel shown in FIG. 8.

FIG. 8 is a part of a schematic layout of pixels included in a display device according to one embodiment of the present invention. FIG. 9 is a schematic cross-sectional diagram along the line A1-A2 of the pixel shown in FIG. 8. FIG. 8 and FIG. 9 show a state in which a gate insulating film 144 is arranged on a semiconductor layer. FIG. 8 and FIG. 9 show a state in which a scanning signal line 410, a gate electrode 146, and a light emitting control line 418 are further arranged on the gate insulating film 144. As is shown in FIG. 8, a reset control line 416_1 and a reset control line 416_2 are also arranged in the same layer as the gate electrode 146. A region of the semiconductor layer 141 which overlaps with the gate electrode 146 is a channel region. In addition, a region where the semiconductor layer 141 overlaps the scanning signal line 410, the light emitting control line 418, the reset control line 416_1 and the reset control line 416_2 which are arranged in the same layer as the gate electrode 146 is also a channel region. A region where the reset control line 416_1 and the semiconductor layer 141 overlap is a channel region 142b of the second reset transistor RST2(n). A region where the scanning signal line 410 and the semiconductor layer 141 overlap is a channel region 142c of the correcting transistor TOT. A region where the scanning signal line 410 and the semiconductor layer 141 overlap is a channel region 142d of the selection transistor SST. A region where the gate electrode 146 and the semiconductor layer 141e overlap is a channel region 142e of the drive transistor DRT. A region where the light emitting control line 418 and the semiconductor layer 141 overlap is a channel region 142f of the light emitting control transistor BCT. A region where the light emitting control line 418 and the semiconductor layer 141 overlap is a channel region 142g of the power supply transistor PST. A region where the reset control line 416_2 and the semiconductor layer 141 overlap is a channel region 142h of the first reset transistor RST(n). Impurities such as boron or phosphorus are injected into the region 141b of the semiconductor layer 141 which does not overlap with any of the scanning signal line 410, the gate electrode 146 and the light emitting control line 418.

The auxiliary capacitor element Csx (auxiliary capacitor element 442) is formed by the semiconductor layer 141d, the gate electrode 146 and the gate insulating film 144 which is sandwiched between the gate electrode 146 and the semiconductor layer 141d. The structural elements of the auxiliary capacitor element Csx are not limited to those described above. For example, the auxiliary capacitor element Csx may also be formed by making the gate electrode 146 described herein and the capacitor line 412 described following face each other interposed by an insulating film. In addition, the auxiliary capacitor element Csx may also be formed by making the capacitor line 412 and a pixel electrode of the light emitting element OLED face each other interposed by an insulating film. Furthermore, as is shown in FIG. 8, the gate electrode 146 and the semiconductor layer 141d overlap.

Figure 10:
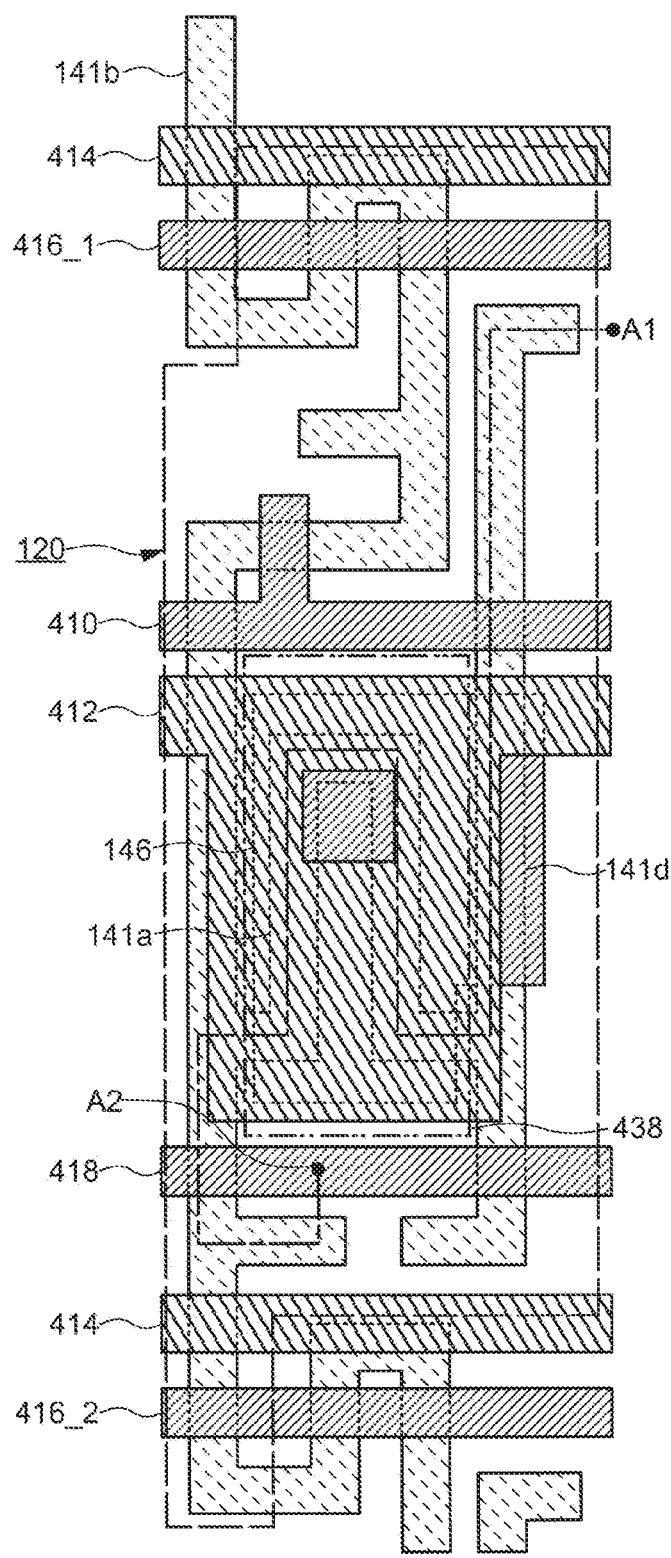
FIG. 10 is a schematic layout of a pixel included in a display device related to one embodiment of the present invention.
Figure 11:
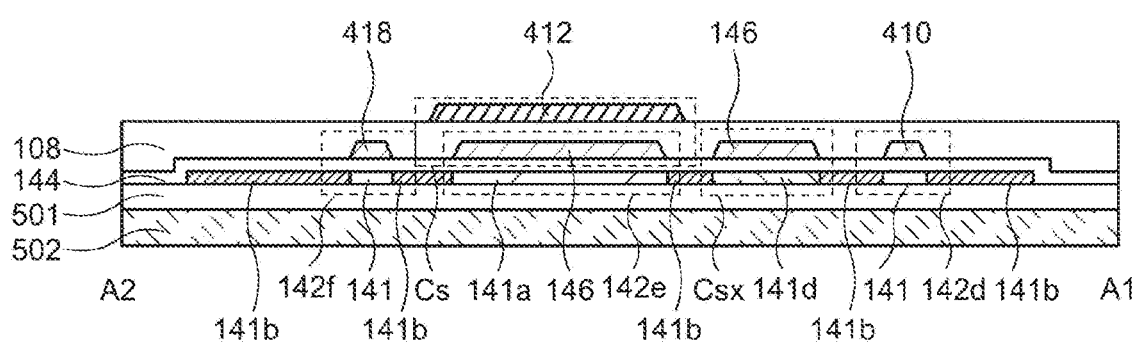
FIG. 11 is a schematic cross-sectional diagram along the line A1-A2 of the pixel shown in FIG. 10.

FIG. 10 is a part of a schematic layout of pixels included in a display device according to one embodiment of the present invention. FIG. 11 is a schematic cross-sectional diagram along the line A1-A2 of the pixel shown in FIG. 10. FIG. 10 and FIG. 11 show a state in which the insulating film 108 is arranged in the state shown in FIG. 8 and FIG. 9. FIG. 10 and FIG. 11 show a state in which the capacitor line 412 is further arranged above the insulating film 108. As is shown in FIG. 10, a reset potential line 414 is also arranged in the same layer as the capacitor line 412. The insulating film 108 is arranged over each of transistor, storage capacitor element Cs and storage capacitor element Csx. Furthermore, the capacitor line 412 and the gate electrode 146 overlap. In addition, the capacitor line 412 and the semiconductor layer 141 overlap.

The storage capacitor element Cs is formed by the capacitor line 412, the gate electrode 146 and the insulating film 108 sandwiched between the capacitor line 412 and the gate electrode 146. Furthermore, the storage capacitor element Cs may be formed by the gate electrode 146, the semiconductor layer 141a and the gate insulating film 144 sandwiched between the gate electrode 146 and the semiconductor layer 141a. The structural elements of the storage capacitor element Cs are not limited to those described above. For example, the storage capacitor element Cs may be formed by making the capacitor line 412 and a pixel electrode of the light emitting element OLED face each other interposed by an insulating film.

Each transistor is formed by sandwiching a channel region between a pair of source and drain regions (not shown in the diagram). In one embodiment of the present invention, the semiconductor layer 141 of each transistor is formed by the same film.

Figure 12:
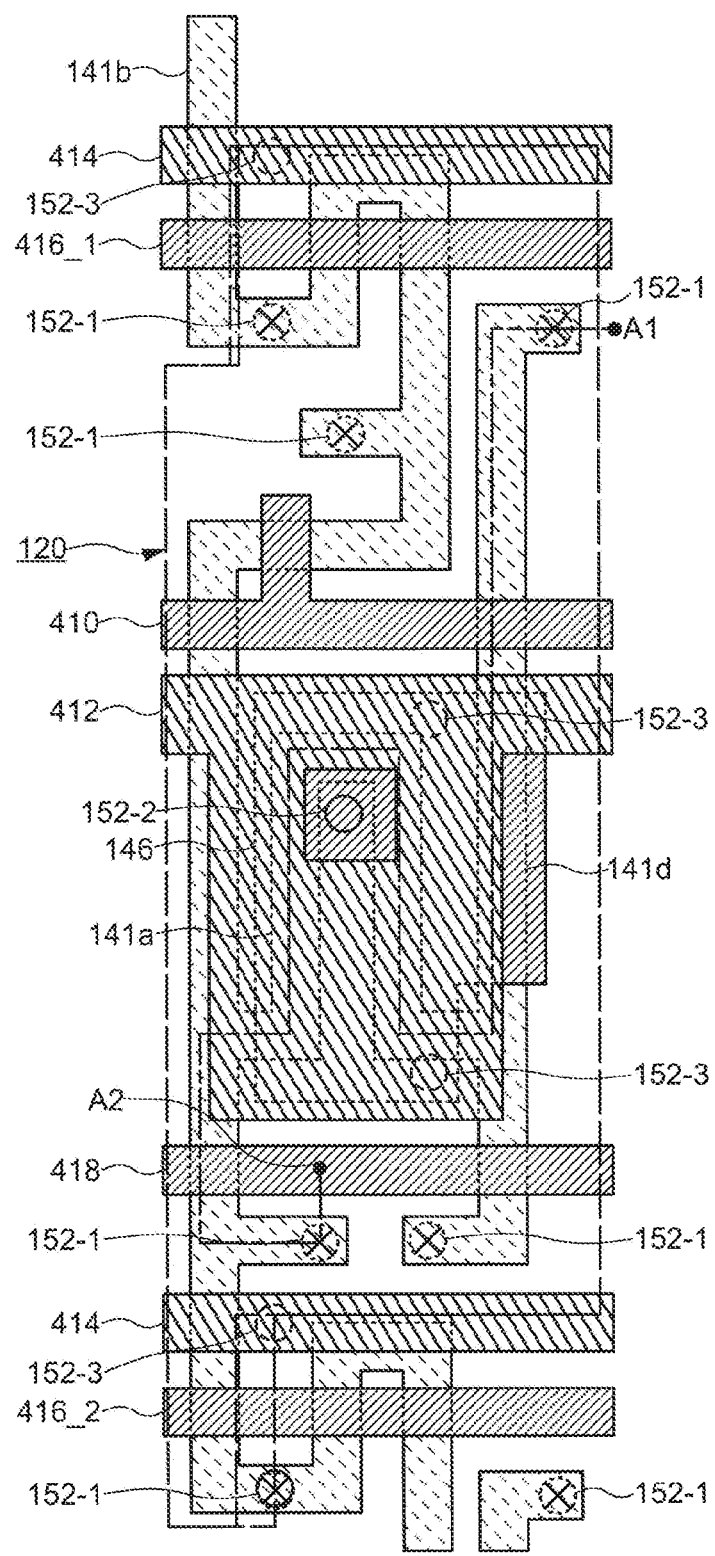
FIG. 12 is part of a schematic layout of a pixel included in a display device related to one embodiment of the present invention.
Figure 13:
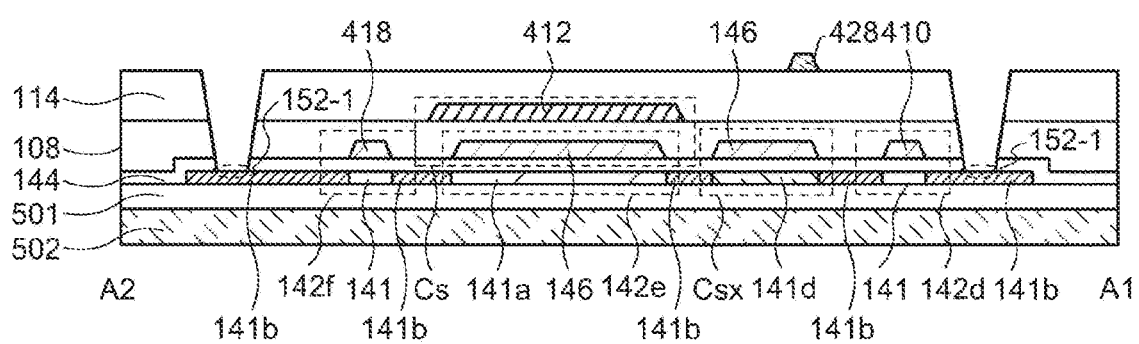
FIG. 13 is a cross-sectional diagram of part of a schematic layout of the pixel shown in FIG. 12.

FIG. 12 is a part of a schematic layout of pixels included in a display device according to one embodiment of the present invention. FIG. 13 is a schematic cross-sectional diagram along the line A1-A2 of the pixel shown in FIG. 12. FIG. 12 and FIG. 13 show a state in which the insulating film 114 is arranged in the state shown in FIG. 10 and FIG. 11. The insulating film 114 is arranged above the capacitor line 412 and the reset potential line 414. The insulating film 114 can absorb convex/convexities caused by the capacitor line 412 and the reset potential line 414, and the surface of the display device 100 can be planarized.

An opening 152_1 which reaches the semiconductor layer 141 is arranged in the insulating film 108 and the insulating film 114. An opening 152_2 which reaches the gate electrode 146 is arranged in the insulating film 108 and the insulating film 114. An opening 152_3 which reaches the capacitor line 412 is arranged in the insulating film 108 and the insulating film 114.

Figure 14:
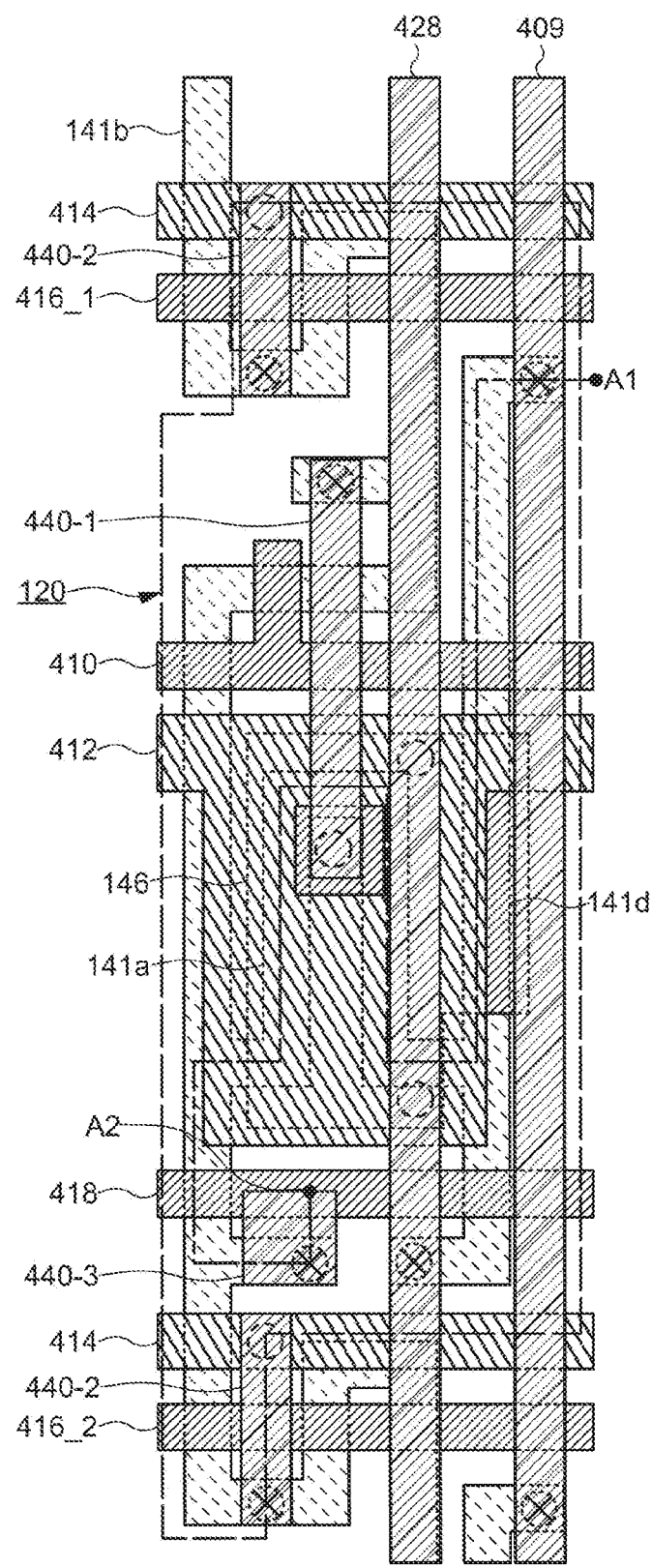
FIG. 14 is part of a schematic layout of a pixel included in a display device related to one embodiment of the present invention.
Figure 15:
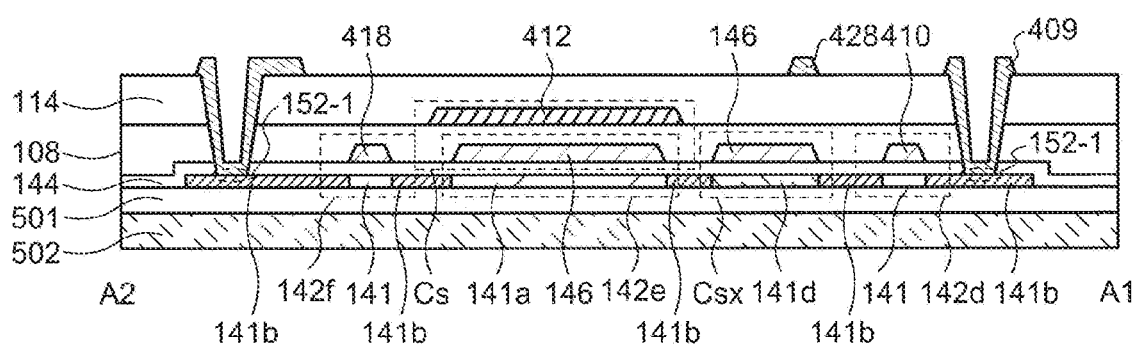
FIG. 15 is a cross-sectional diagram of part of a schematic layout of the pixel shown in FIG. 14.

FIG. 14 is a part of a schematic layout of pixels included in a display device according to one embodiment of the present invention. FIG. 15 is a schematic cross-sectional diagram along the line A1-A2 of the pixel shown in FIG. 14. FIG. 14 and FIG. 15 show a state in which the image signal line 409, the drive power supply line 428, a conductive layer 440_1, a conductive layer 440_2 and a conductive layer 440_3 are arranged in the state shown in FIG. 12 and FIG. 13.

The image signal line 409 is electrically connected to the semiconductor layer 141 through the opening 152-1. The drive power supply line 428 is electrically connected to the capacitor line 412 through the opening 152_3. The conductive layer 440_3 is electrically connected to the semiconductor layer 141 through the opening 152_1. The conductive layer 440_1 and the conductive layer 440_2 are electrically connected to the semiconductor layer 141 through the opening 152_1. In addition, the conductive layer 440_1 and the conductive layer 440_2 are electrically connected to the reset potential line 414 through the opening 152_3.

Figure 16:
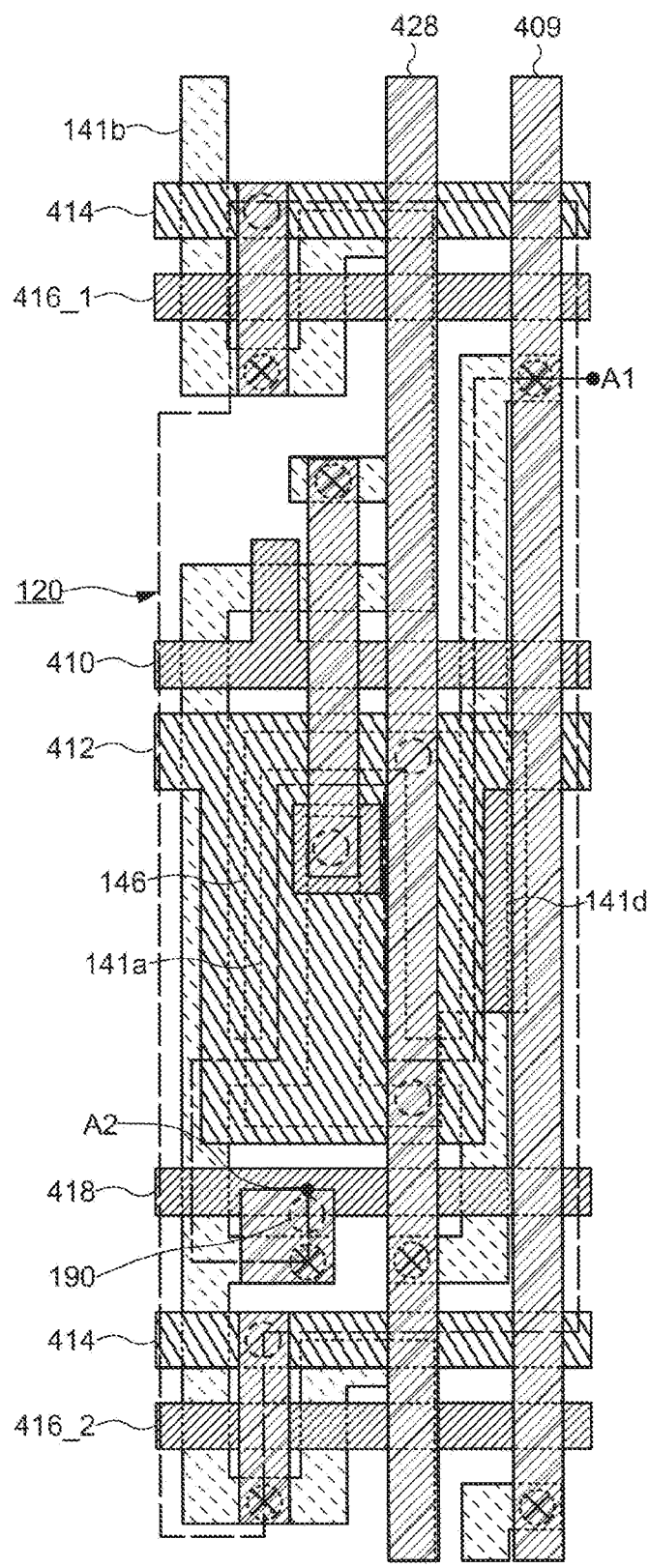
FIG. 16 is part of a schematic layout of a pixel included in a display device related to one embodiment of the present invention.
Figure 17:
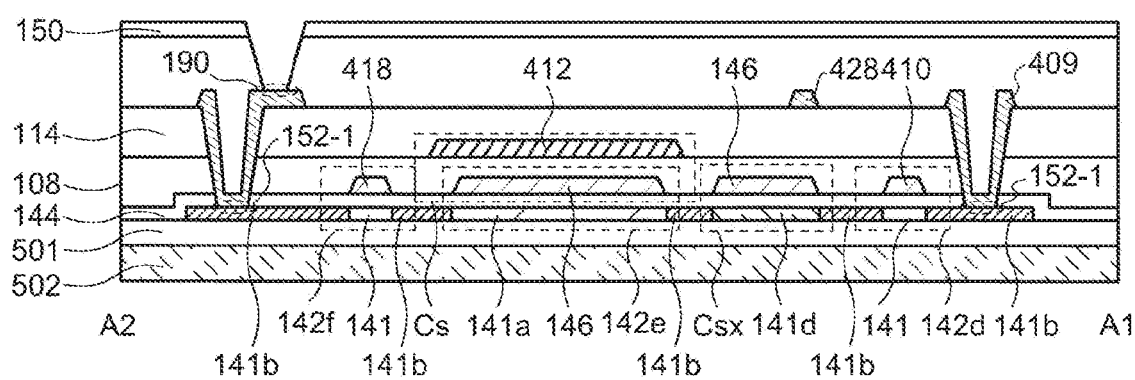
FIG. 17 is a cross-sectional diagram of part of a schematic layout of the pixel shown in FIG. 16.

FIG. 16 is a part of a schematic layout of pixels included in a display device according to one embodiment of the present invention. FIG. 17 is a schematic cross-sectional diagram along the line A1-A2 of the pixel shown in FIG. 16. FIG. 16 and FIG. 17 show a state in which the insulating film 148 and an inorganic insulating film 150 are arranged in the state shown in FIG. 14 and FIG. 15. FIG. 16 and FIG. 17 show a state in which an opening 190 which reaches the conductive layer 440_3 is further arranged. Similar to the insulating film 114, the insulating film 148 also absorbs concave/convexities caused by each signal line and conductive layer and the like and it is possible to planarize the surface of the display device 100.

The explanation continues by returning to FIG. 4 and FIG. 5. As is shown in FIG. 4, the pixel electrode 162 is electrically connected to the conductive layer 440_3 through the opening 190.

The light emitting element OLED is formed by a pixel electrode 162, a common electrode 166 (also called a cathode electrode) and a functional layer 164 (also called an organic layer) arranged therebetween. An insulating film 168 (also called a bank or a partition wall) which both exposes a part of the pixel electrode 162 and covers a periphery part of the pixel electrode 162 is arranged on the pixel electrode 162. The insulating film 168 is arranged at a boundary part of a plurality of pixels 120 (or sub-pixels) across the entire surface of the display region 504 shown in FIG. 1. That is, the insulating film 168 partitions a plurality of pixels 120 (or sub-pixels). The functional layer 164 is arranged to cover the pixel electrode 162 and the insulating film 168. Furthermore, a common electrode 166 is arranged on the functional layer 164. The common electrode 166 is arranged across a plurality of pixels 120. Carriers (electrons, holes) are injected into the functional layer 164 from the pixel electrode 162 and the common electrode 166, and carrier recombination occurs in the functional layer 164. In this way, an excited state of an organic compound included in the functional layer 164 is formed, and the energy which is output when the excited state relaxes to a ground state is utilized as emitted light. Therefore, a region where the functional layer 164 and the pixel electrode 162 contact is a light emitting region.

In FIG. 5, the functional layer 164 includes three layers (a layer 164a, a layer 164b, a layer 164c). In FIG. 5, the layer 164a is a hole transport layer, the layer 164b is a light emitting layer and the layer 164c is an electron transport layer. The hole transport layer 164a and the electron transport layer 164c are arranged across a plurality of pixels. The layer structure of the functional layer 164 is not limited to that described above and four or more layers may be stacked. The functional layer 164 may further include, for example, a hole injection layer or an electron injection layer.

A sealing film 180 (also called a passivation film or a protective film) for protecting the light emitting element OLED may be arranged above the light emitting element OLED. For example, as is shown in FIG. 5, the sealing film 180 may have a structure in which a layer 184 (organic film) including an organic compound is sandwiched between two layers including an inorganic compound (first inorganic film 182 and second inorganic film 186).

A cover film 268 is arranged on the sealing film 180. The cover film 268 protects the surface of the display device 100.

Furthermore, each transistor is formed so that a channel region is sandwiched between a pair of source and drain regions (not shown in the diagram). In one embodiment of the present invention, the semiconductor layer 141 of each transistor is formed by the same film. A semiconductor layer 141 of each transistor is independently arranged, a source and drain electrode are arranged for each transistor, and the source and drain electrodes and the source and drain regions of each transistor may be electrically connected via an opening part arranged passing through the insulating film 108, the insulating film 114 and the gate insulating film 144.

2-4. Driving Method

A driving method of a display device according to one embodiment of the present invention is explained using FIG. 18 to FIG. 30. In the explanation using FIG. 18 to FIG. 30, an explanation the same as the content explained in FIG. 1 to FIG. 17 may be omitted.

Figure 18:
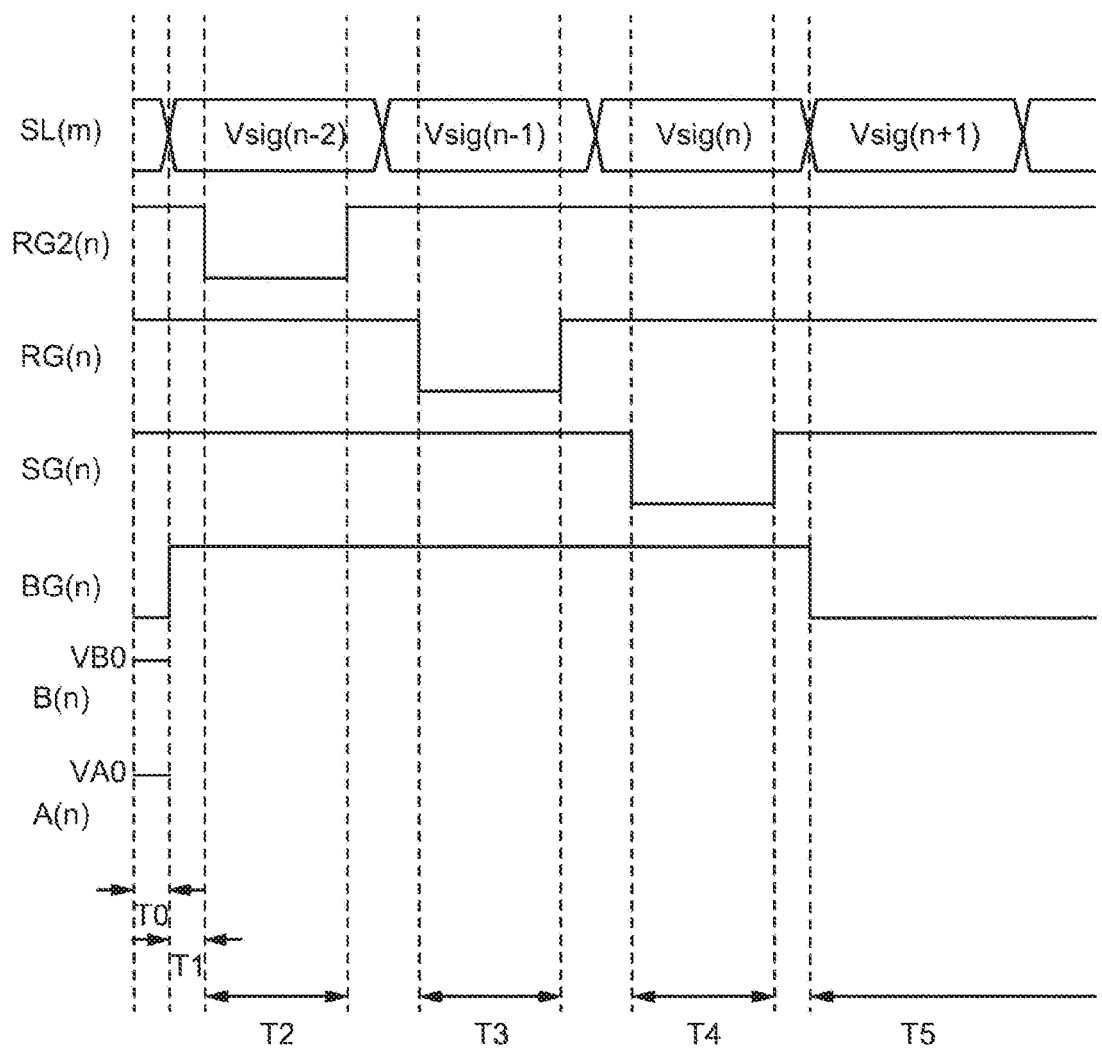
FIG. 18 is a timing chart of a pixel included in a display device related to one embodiment of the present invention.
Figure 19:
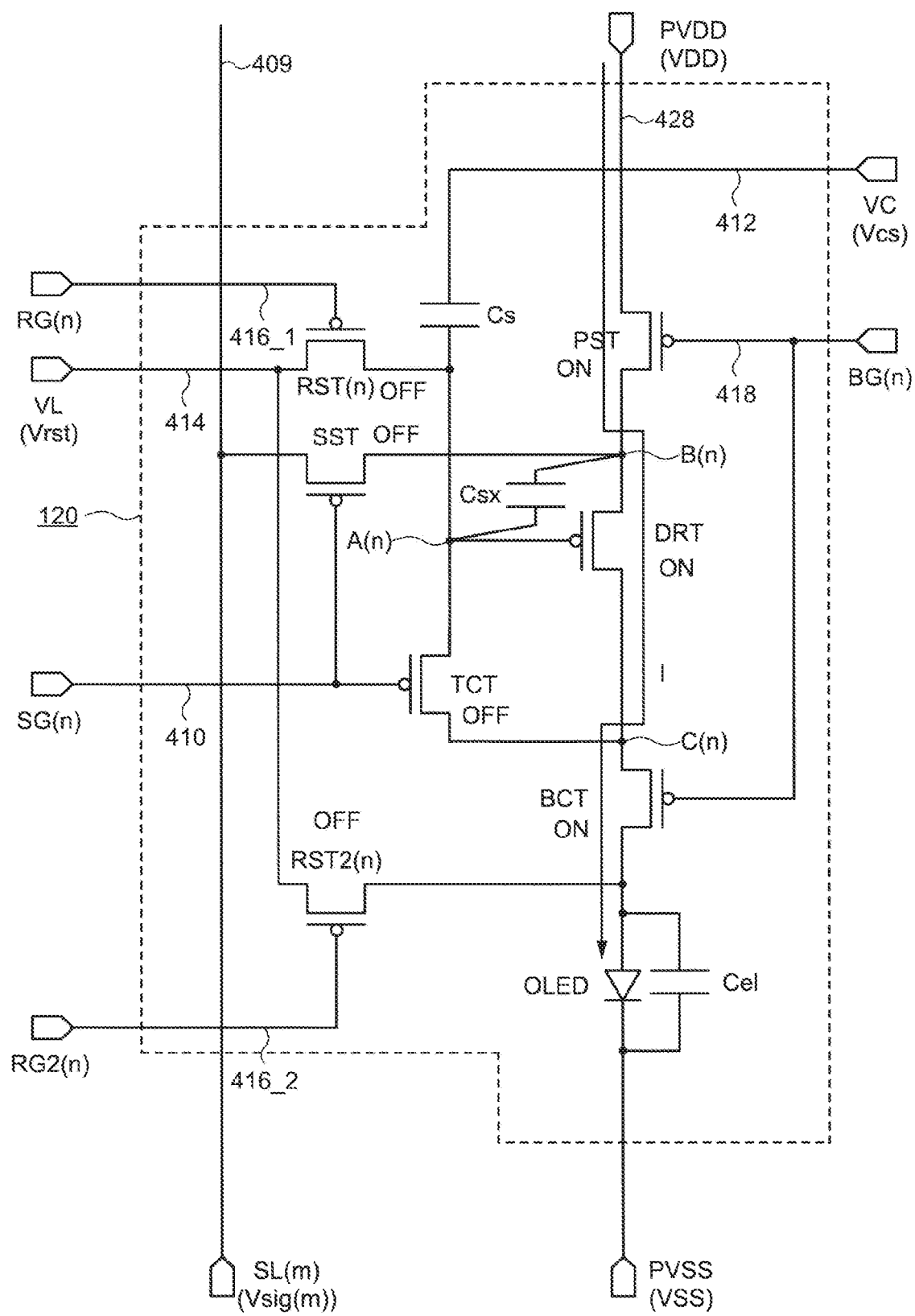
FIG. 19 is a schematic diagram showing an operational state of a pixel in the timing shown in FIG. 18.

FIG. 18 and FIG. 19 show a timing chart of the pixels of m rows and n columns and the state of the pixels of m rows and n columns in a time period T0. In the time period T0, a high potential is supplied to a reset control signal RG (n+1), a reset control signal RG(n), a reset control signal RG2(n) and a scanning signal SG(n). Therefore, the first reset transistor RST(n), the selection transistor SST, the correction transistor TCT and the second reset transistor RST2(n) are in a non-conducting state. In addition, in the time period T0, a low potential is supplied to a light emitting control signal BG(n). Therefore, the power supply transistor PST, the drive transistor DRT, and the light emitting control transistor BCT are in a conductive state. The drive transistor DRT is controlled so that a current flows corresponding to the potential of an image video signal. Therefore, a current flows from the drive power supply line 428 to the reference potential line PVSS, and the light emitting element OLED emits light. The potential of the node A(n) is VA0. The potential of the node B(n) is VB0.

Figure 20:
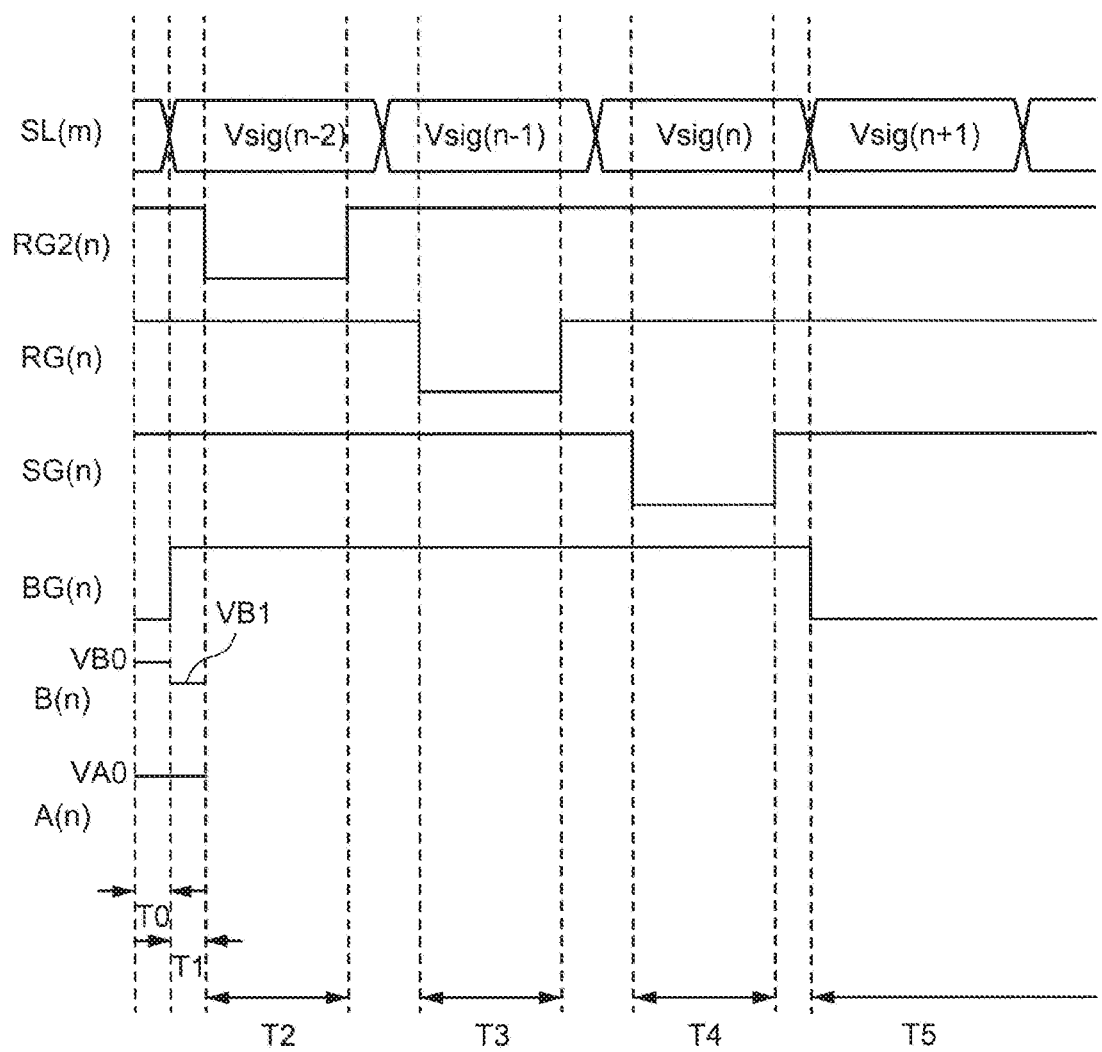
FIG. 20 is a timing chart of a pixel included in a display device related to one embodiment of the present invention.
Figure 21:
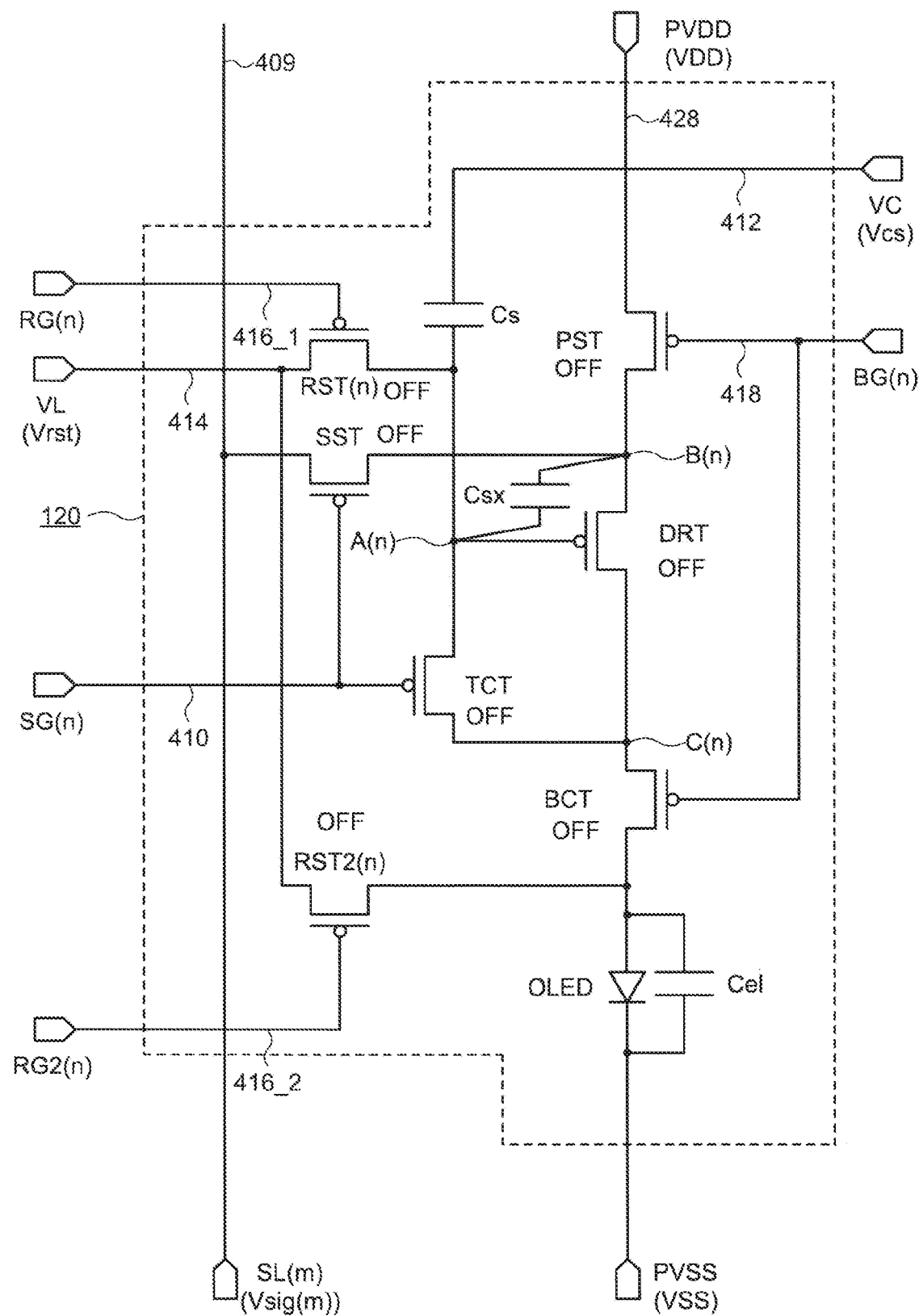
FIG. 21 is a schematic diagram showing an operational state of a pixel in the timing shown in FIG. 20.

FIG. 20 and FIG. 21 show a timing chart of the pixels of m rows and n columns and a state of the pixels of m rows and n columns in the time period T1. In the time period T1, the potential supplied to the light emitting control signal BG(n) changes from a low potential to a high potential. Therefore, the power supply transistor PST and the light emitting control transistor BCT also enters a non-conducting state. Therefore, a current no longer flows from the drive power supply line 428 to the reference potential line PVSS. Therefore, the light emitting element OLED becomes non-light emitting. At this time, the potential of the node A(n) is maintained at VA0. In addition, the potential of the node B(n) is changed from VB0 to VB1. VB1 is a value obtained by subtracting Vth from VA0. When the potential of the node B(n) changes from VB0 to VB1, the drive transistor DRT enters a non-conducting state. Furthermore, Vth is a threshold voltage of the drive transistor.

Figure 22:
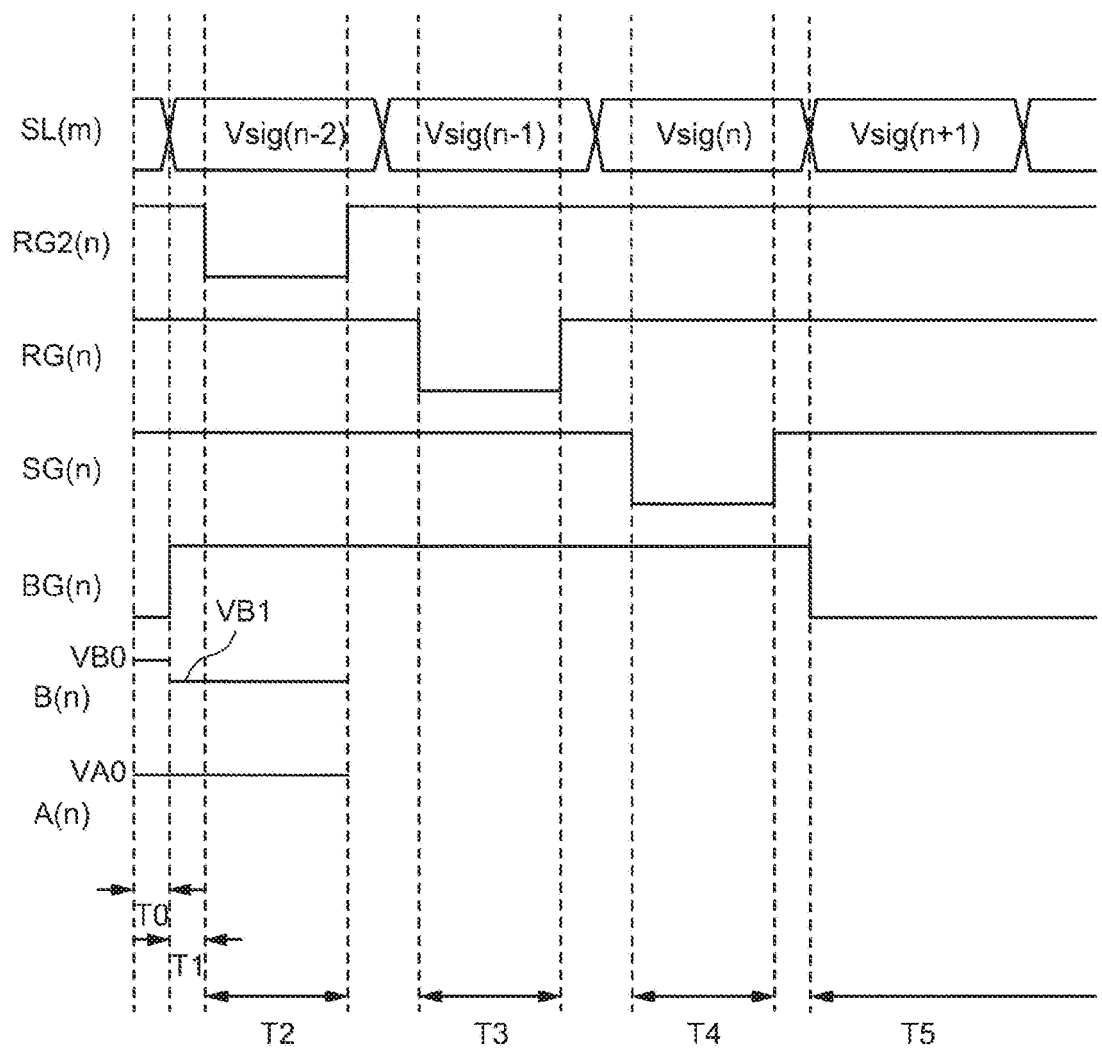
FIG. 22 is a timing chart of a pixel included in a display device related to one embodiment of the present invention.
Figure 23:
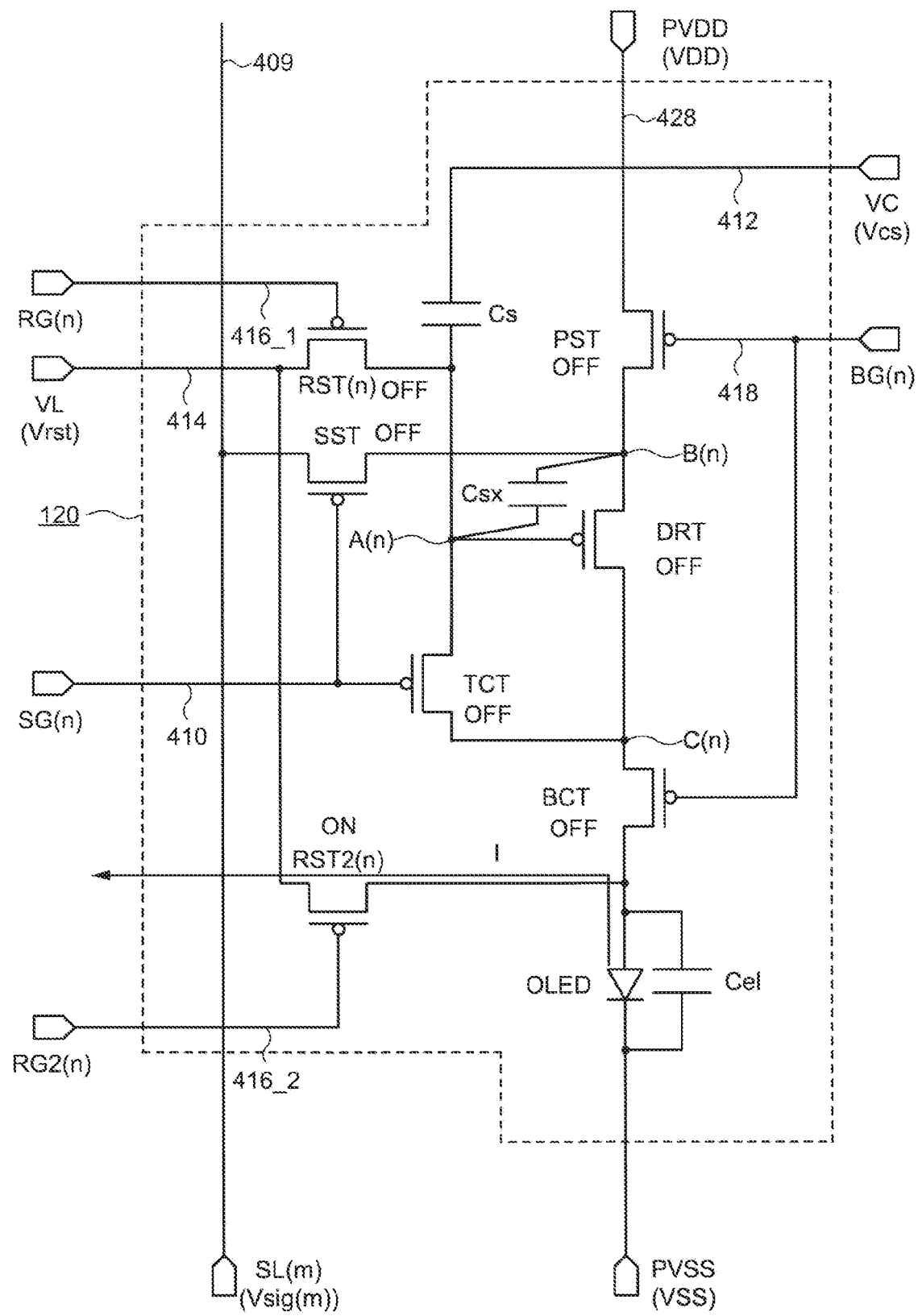
FIG. 23 is a schematic diagram showing an operational state of a pixel in the timing shown in FIG. 22.

FIG. 22 and FIG. 23 show a timing charts of the pixels of m rows and n columns and a state of the pixels of m rows and n columns in the time period T2. In the time period T2, a potential supplied to the reset control signal RG2(n) changes from a high potential to a low potential. Therefore, the second reset transistor RST2(n) enters a conductive state. Therefore, the reset potential Vrst which is supplied to the reset potential line 414 is supplied to the first terminal (pixel electrode) of the light emitting element OLED. The reset potential Vrst is substantially the same as the reference potential VSS which is supplied to the reference potential line PVSS. Therefore, the light emitting element OLED is non-light emitting. In other words, the light emitting element OLED is reset. At this time, the potential of the node A(n) is maintained at VA0. In addition, the potential of the node B(n) is maintained at VB1. Following this, the potential of the node A(n) is maintained at VA0 and the potential of the node B(n) is maintained at VB1 also in the period between the time period T2 and the time period T3.

Figure 24:
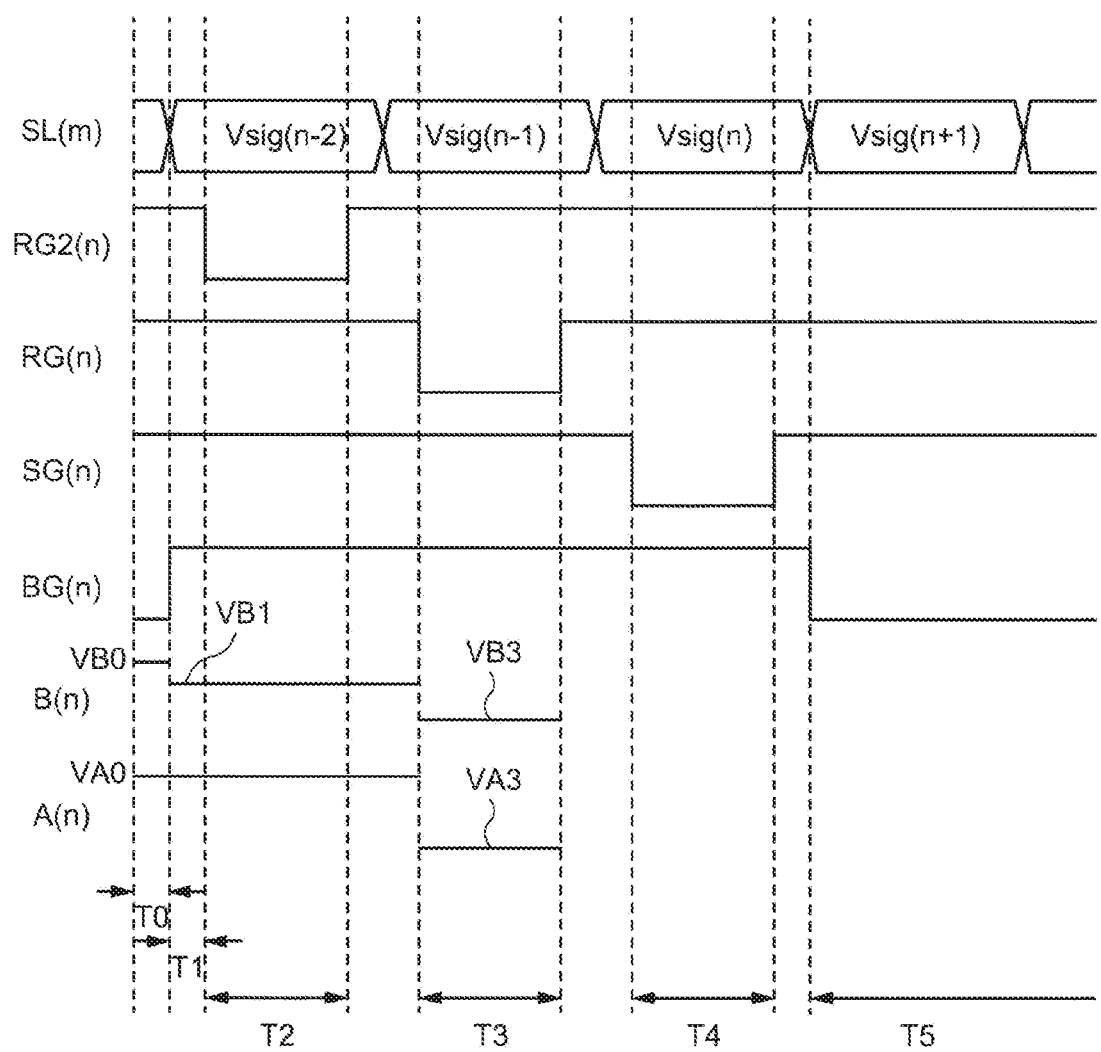
FIG. 24 is a timing chart of a pixel included in a display device related to one embodiment of the present invention.
Figure 25:
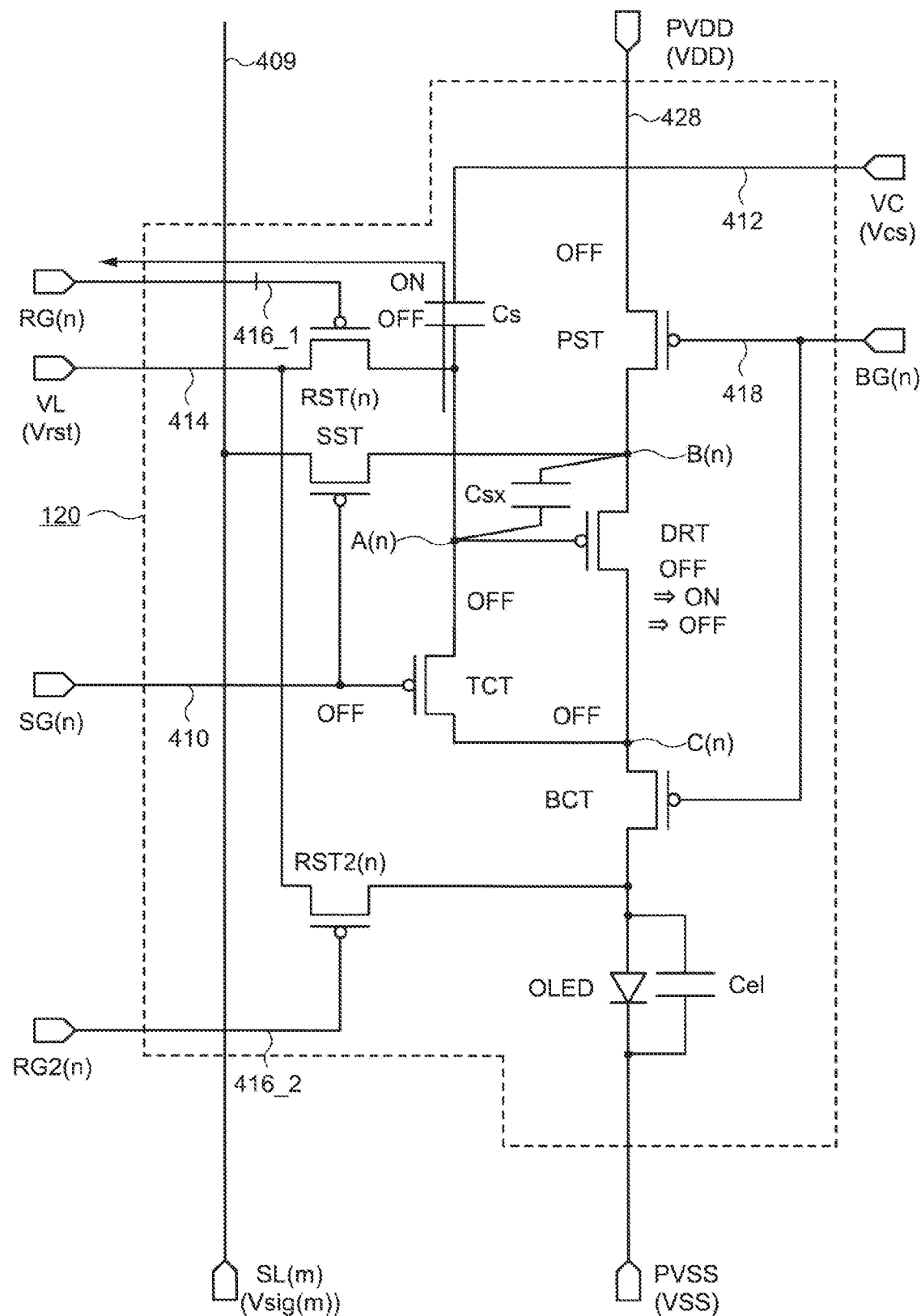
FIG. 25 is a schematic diagram showing an operational state of a pixel in the timing shown in FIG. 24.

FIG. 24 and FIG. 25 show a timing chart of the pixels of m rows and n columns and a state of the pixels of m rows and n columns in the time period T3. Between the time period T2 and the time period T3, the potential which is supplied to the reset control signal RG2(n) changes from a low potential to a high potential. Therefore, the second reset transistor RST2(n) enters a non-conducting state. In addition, in the time period T3, the potential which is supplied to the reset control signal RG(n) changes from a high potential to a low potential. Therefore, the first reset transistor RST(n) enters a conductive state. Therefore, the reset potential Vrst which is supplied to the reset potential line 414 is applied to the gate electrode of the drive transistor DRT, the source electrode of the correction transistor TCT, the first terminal of the auxiliary capacitor element Csx, and the first terminal of the storage capacitor element Cs. Since the gate electrode of the drive transistor DRT, the source electrode of the correction transistor TCT, the first terminal of the auxiliary capacitor element Csx, and the first terminal of the storage capacitor element Cs are electrically connected to the node A(n), the potential of the node A(n) is also Vrst. At this time, the potential (Vrst) of the gate electrode of the drive transistor DRT is smaller than the potential of the source electrode of the drive transistor DRT. Therefore, the drive transistor DRT is in a conducting state for a short time. Following this, the potential of the node B(n) is changed from VB1 to VB3. VB3 is a value obtained by subtracting Vth from Vrst. When the potential of the node B(n) changes from VB1 to VB3, the drive transistor DRT enters a non-conducting state. Furthermore, Vth is a threshold voltage of the drive transistor. The potential of the node A(n) is VA3, and VA3 is Vrst. Following this, the potential of the node A(n) is also maintained at VA3 during the period between the time period T3 and the time period T4.

Figure 26:
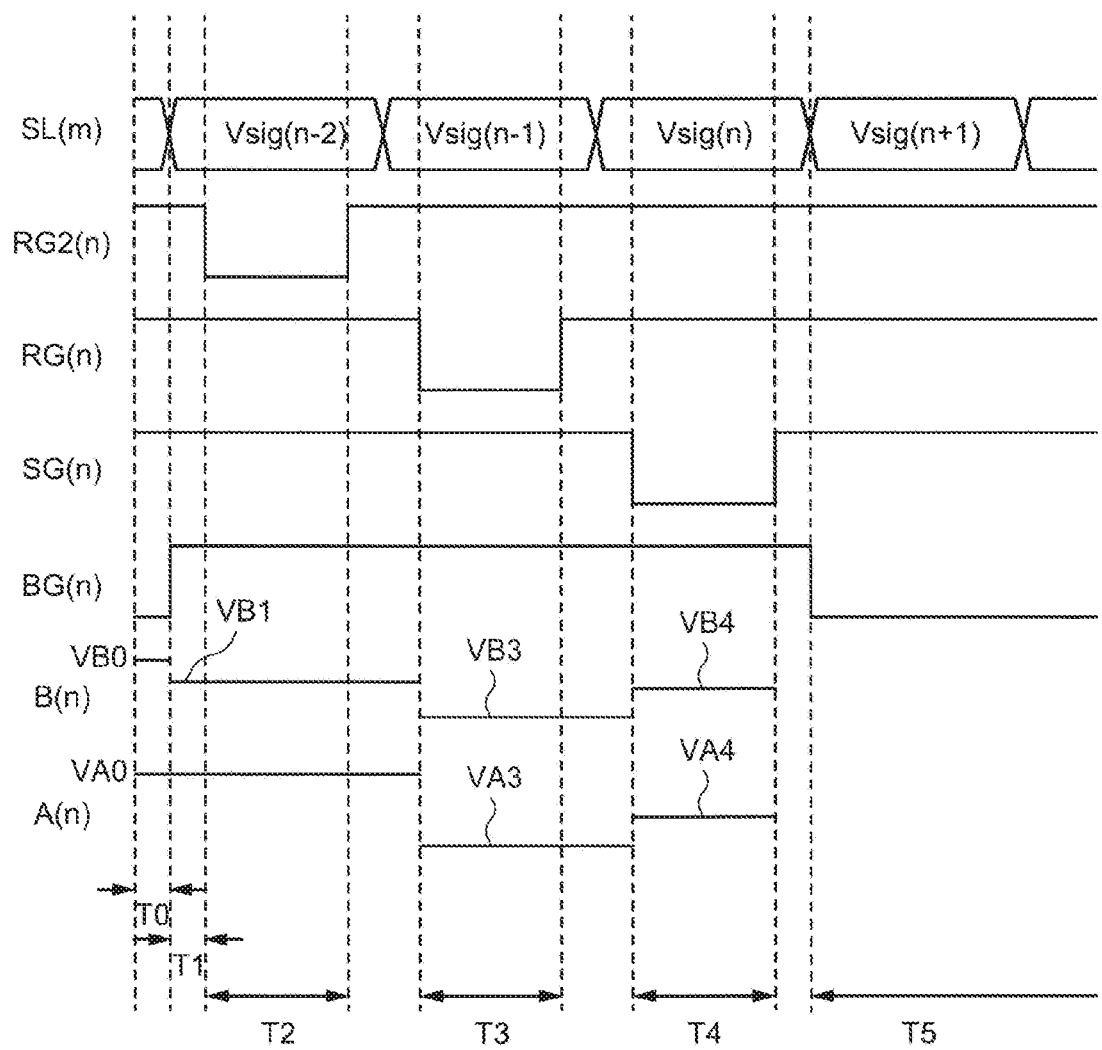
FIG. 26 is a timing chart of a pixel included in a display device related to one embodiment of the present invention.
Figure 27:
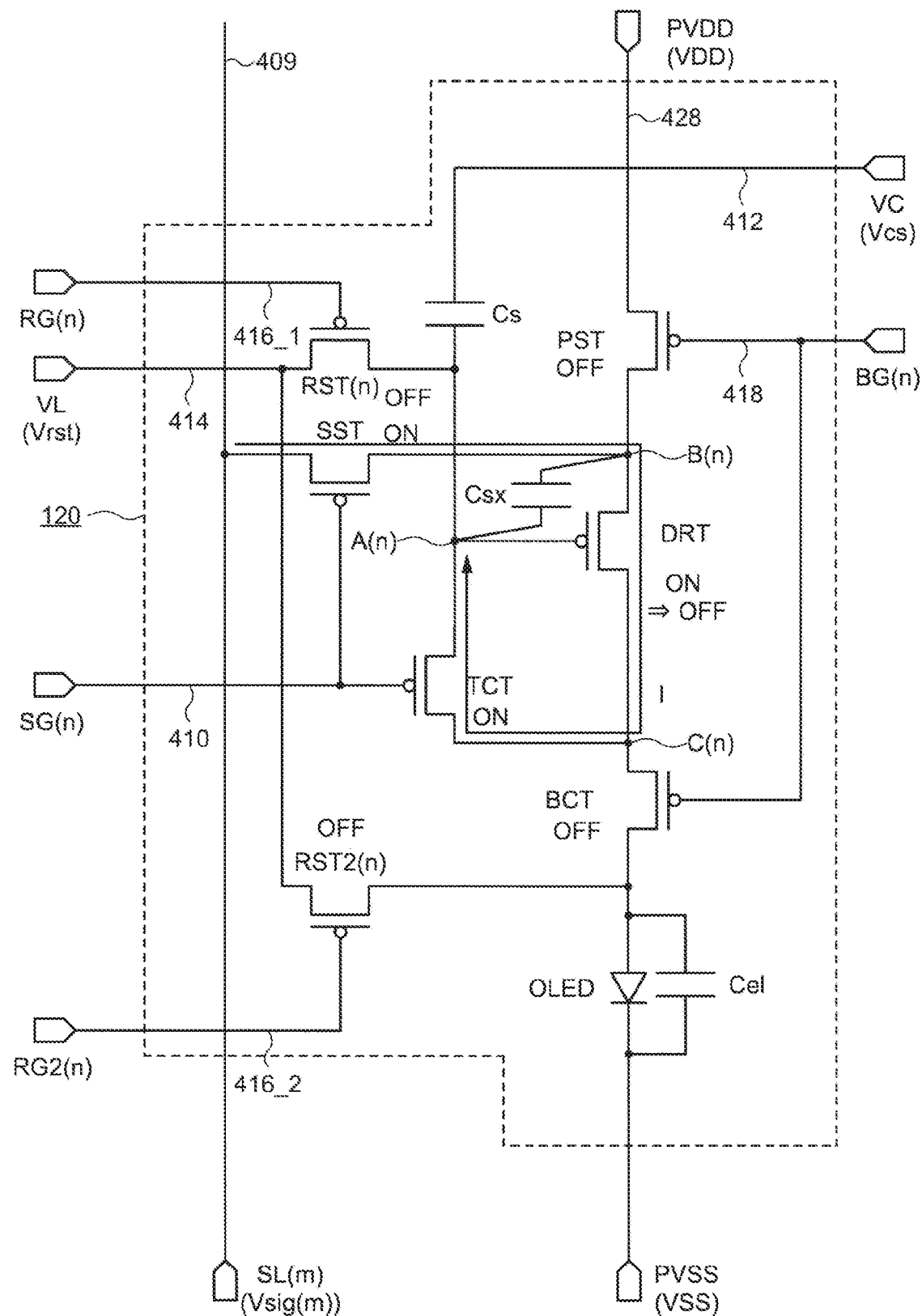
FIG. 27 is a schematic diagram showing an operational state of a pixel in the timing shown in FIG. 26.

FIG. 26 and FIG. 27 show a timing chart of the pixels of m rows and n columns and a state of the pixels of m rows and n columns in the time period T4. Between the time period T3 and the time period T4, the potential which is supplied to the reset control signal RG(n) changes from a low potential to a high potential. Therefore, the first reset transistor RST(n) enters a non-conducting state. In addition, in the time period T4, the potential which is supplied to the scanning signal SG(n) changes from a high potential to a low potential. Therefore, the selection transistor SST and the correction transistor TCT enter a conductive state. Therefore, the gate electrode and the drain electrode of the drive transistor DRT are short-circuited. When the potential Vsig (n) of the image signal SL(m) is supplied to the image signal line 409, the drain electrode of the selection transistor SST, the drain electrode of the power supply transistor PST, the source electrode of the drive transistor DRT, and the second terminal of the auxiliary capacitor element Csx become Vsig(n). Since the drain electrode of the selection transistor SST, the drain electrode of the power supply transistor PST, the source electrode of the drive transistor DRT, and the second terminal of the auxiliary capacitor Csx are electrically connected to the node B(n), the node B(n) is also Vsig(n). In the drive transistor DRT, the potential of the source electrode is Vsig(n), which is larger than the potential of the short-circuited gate electrode and the potential of the drain electrode. Therefore, the drive transistor DRT is in a conducting state. Therefore, the gate electrode and the drain electrode of the drive transistor DRT, the source electrode and the drain electrode of the correction transistor TCT, the first terminal of the auxiliary capacitor element Csx, the first terminal of the storage capacitor element Cs, and the drain electrode of the first reset transistor RST are also supplied with Vsig(n) from the image signal line 409. Since the gate electrode of the drive transistor DRT, the source electrode of the correction transistor TCT, the first terminal of the auxiliary capacitor element Csx, the first terminal of the storage capacitor element Cs, and the drain electrode of the first reset transistor RST(n) are electrically connected to the node A(n), the node A(n) is also charged. Following this, at the point when the potential of the node A(n) becomes a value obtained by adding Vth to Vsig(n) and the voltage between the gate and the source of the drive transistor DRT becomes equal to the threshold voltage of the drive transistor DRT, the drive transistor DRT enters a non-conducting state. Finally, in the time period T4, the potential VA4 of the node A(n) is a value obtained by adding Vth to Vsig(n). In the time period T4, the potential VB4 of the node B(n) is finally Vsig(n). Therefore, it is possible to maintain a charge corresponding to the threshold voltage of the drive transistor DRT between the node A(n) and the node B(n), that is, in the auxiliary capacitor element Csx. That is, the display device of the present invention can correct a threshold value of the drive transistor DRT in the time period T4. Following this, the potential of the node A(n) is maintained at VA4 and the potential of the node B(n) is maintained at VB4 also in the period between the time period T4 and the time period T5.

Figure 28:
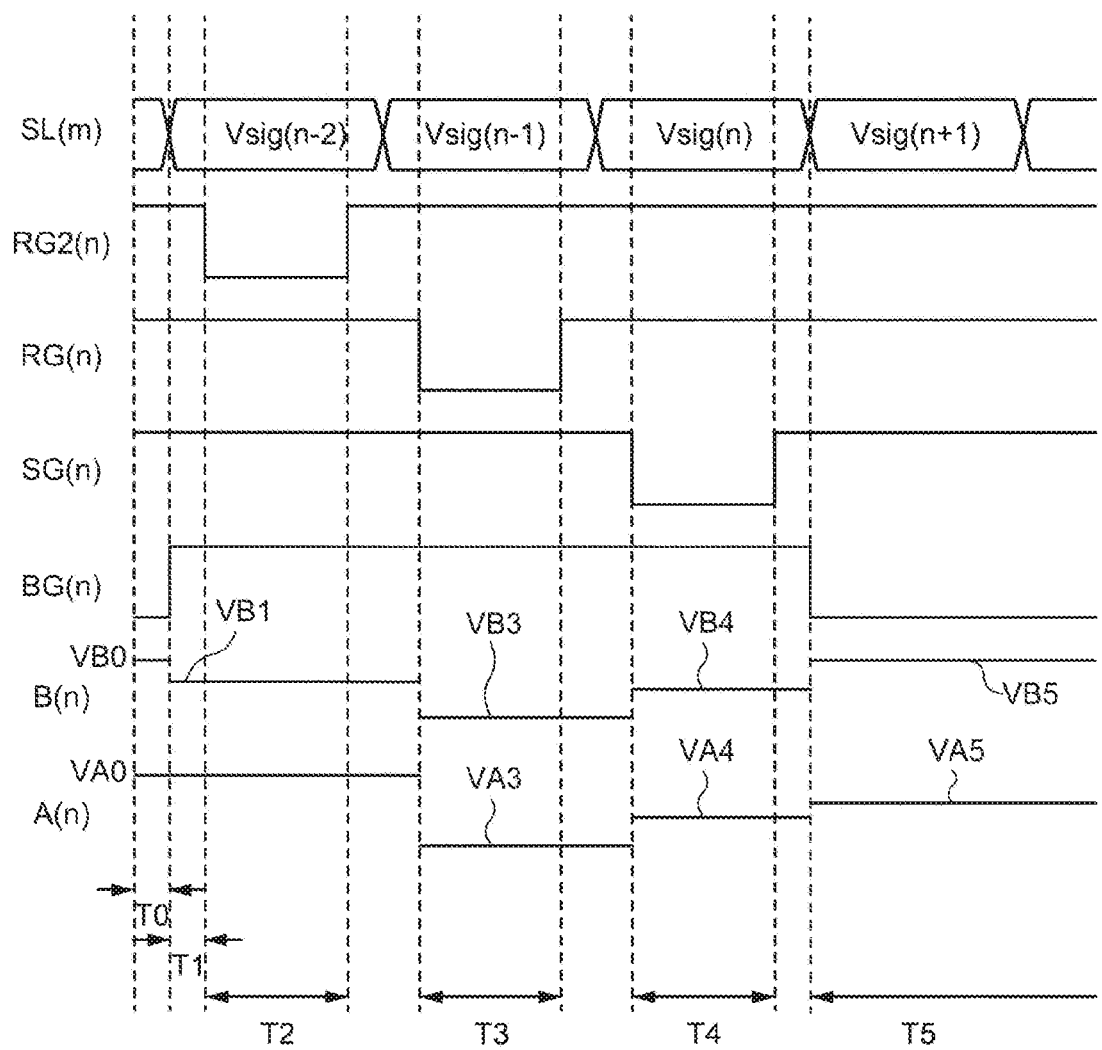
FIG. 28 is a timing chart of a pixel included in a display device related to one embodiment of the present invention.
Figure 29:
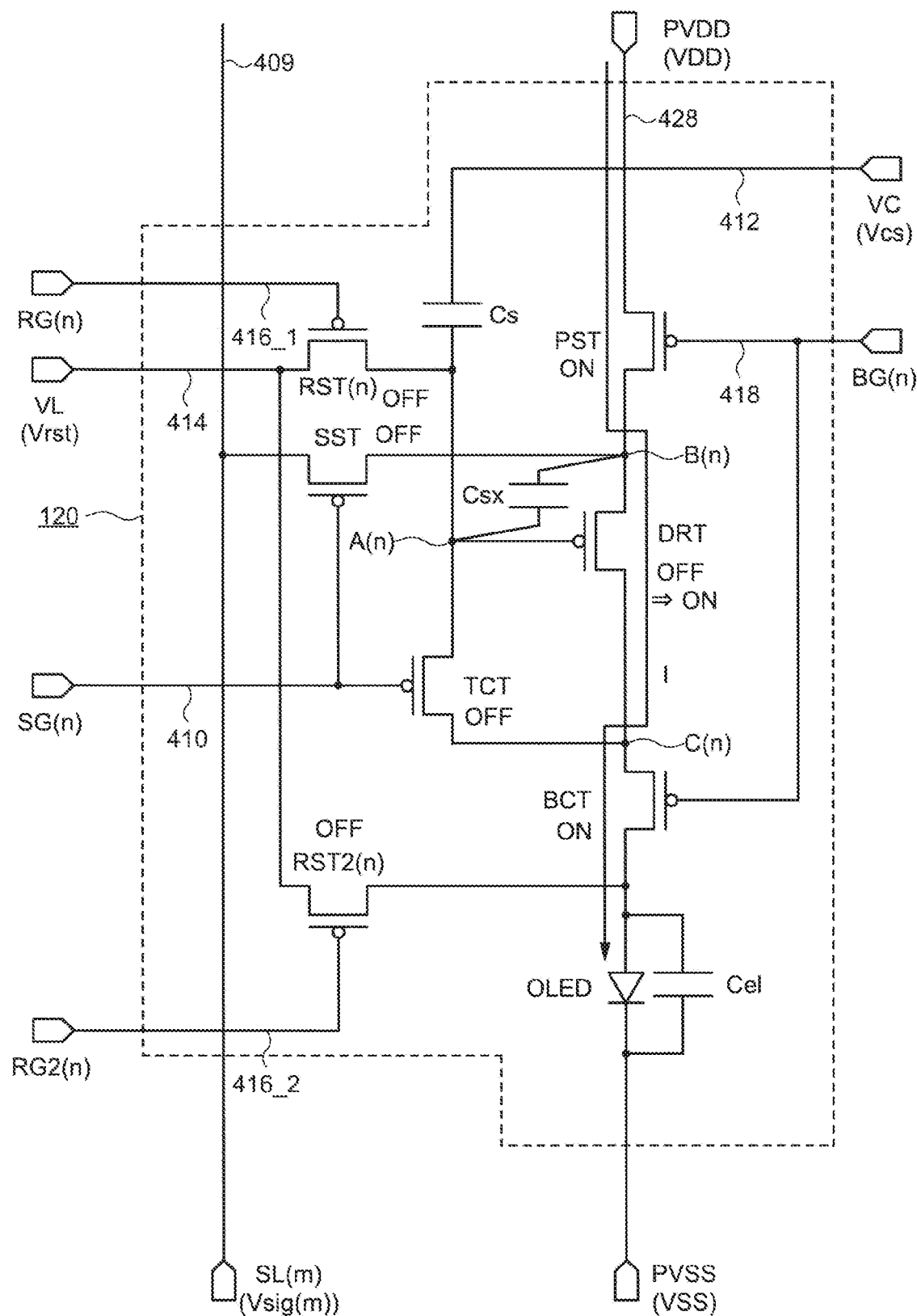
FIG. 29 is a schematic diagram showing an operational state of a pixel in the timing shown in FIG. 28.

FIG. 28 and FIG. 29 show a timing chart of the pixels of m rows and n columns and a state of the pixels of m rows and n columns in the time period T5. Between the time period T4 and the time period T5, a potential which is supplied to the scanning signal SG(n) changes from a low potential to a high potential. Therefore, the selection transistor SST and the correction transistor TCT enter a non-conducting state. In the time period T5, the potential which is supplied to the light emitting control signal BG(n) changes from a high potential to a low potential. Therefore, the power supply transistor PST and the light emitting control transistor BCT enter a conductive state. Since the source electrode of the power supply transistor PST is connected to the drive power supply line 428, the potential of the node B(n) becomes the potential VDD which is supplied to the drive power supply line 428. The potential of the source electrode of the drive transistor DRT is VDD. Since the display device according to one embodiment of the present invention includes the auxiliary capacitor element Csx, the potential of the node B(n) becomes equal to the potential VDD which is supplied to the drive power supply line 428 and the potential of the node A(n) increases. Therefore, the potential between the source electrode and the gate electrode of the drive transistor DRT is expressed by equation 1 described above. Therefore, the drive transistor DRT is controlled so that a current flows corresponding to the potential in equation 1. Therefore, a current flows from the drive power supply line 428 to the reference potential line PVSS and the light emitting element OLED emits light.

Although resetting of the first terminal (anode) of the light emitting element OLED is performed in the time period T2, and resetting of the gate of the drive transistor DRT is performed in the period T3 in the description give above, the order is not limited to this order. Resetting of the first terminal (anode) of the light emitting element OLED may be performed while the power supply transistor PST and the light emitting control transistor BCT are non-conducting. Resetting of the gate of the drive transistor DRT may be performed until writing of an image signal is started. Control signals which are used for controlling each transistor may be used in common or control signals in rows other than these rows may be used as control signals of these other rows.

By including the auxiliary capacitor element Csx in the display device according to one embodiment of the present invention, it is possible to increase the potential of the gate electrode of the drive transistor DRT by a voltage corresponding to the ratio Csv/(Csv+Csxv). Therefore, it is possible to compress Vgs of the drive transistor DRT with respect to the voltage of an image signal. Therefore, by providing the display device in one embodiment of the present invention with the auxiliary capacitor element Cx, it is possible to make the dynamic range of an image signal wider than the dynamic range of Vgs of the drive transistor DRT. Therefore, the display device according to one embodiment of the present invention can suppress uneven luminosity due to variations in image signals.

3. Second Embodiment

In the present embodiment, another structure of a display device according to one embodiment of the present invention is explained. Furthermore, explanations regarding the same structure as in the first embodiment may be omitted.

Figure 30:
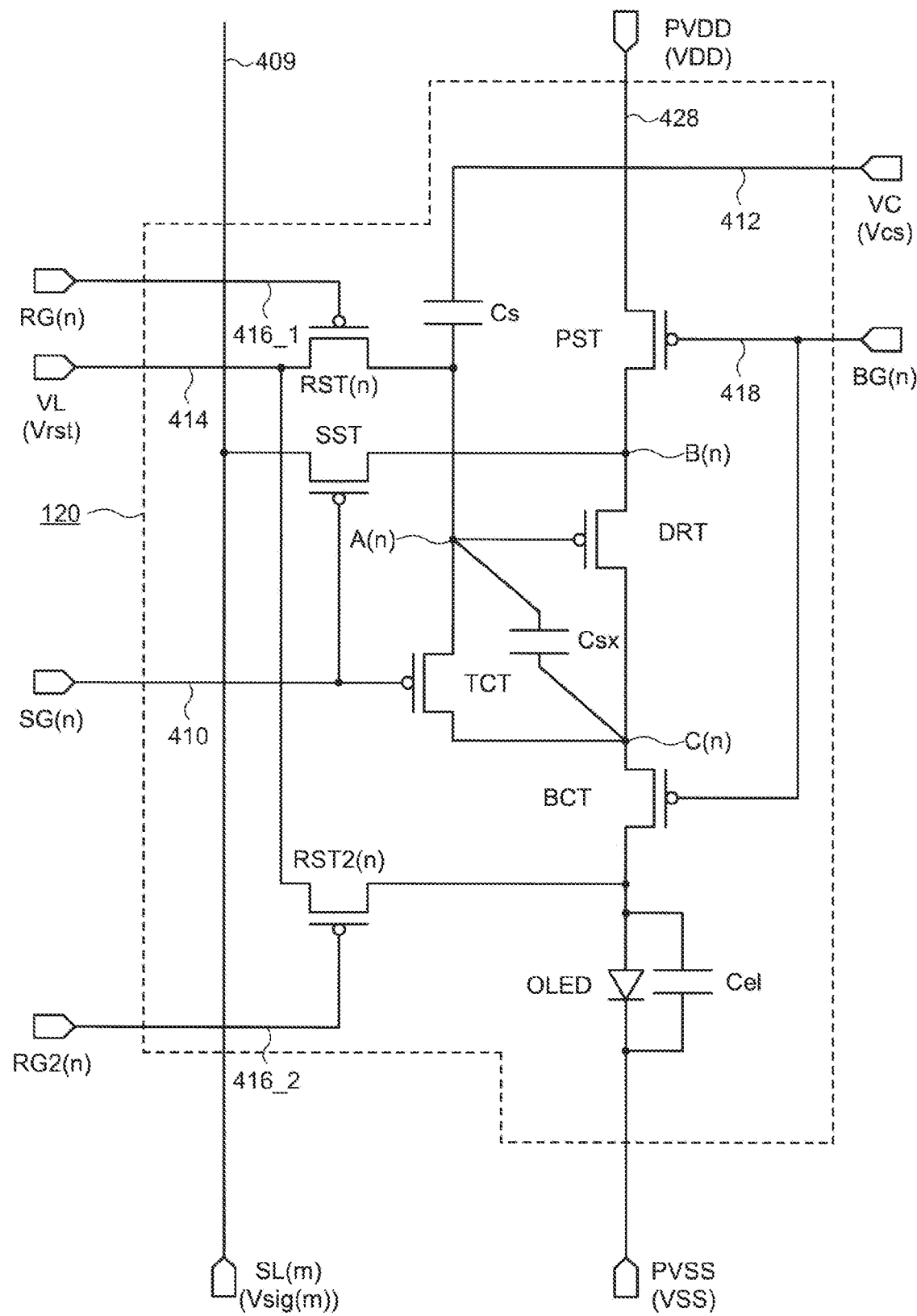
FIG. 30 is a circuit diagram of a pixel included in a display device related to one embodiment of the present invention.

FIG. 30 is a circuit diagram of a pixel 120 according to one embodiment of the present invention. FIG. 30 shows a circuit diagram of the pixel 120 of n rows and m columns shown in FIG. 2. The pixel 120 may also be a sub-pixel. FIG. 30 is different to the circuit diagram shown in FIG. 3 in that the auxiliary capacitor element Csx is arranged between a node A(n) which is connected to the gate electrode of the drive transistor DRT and a node C(n) which is connected to the drain electrode of the drive transistor DRT. The rest of the structure is the same as in FIG. 3 and therefore an explanation is omitted.

Figure 31:
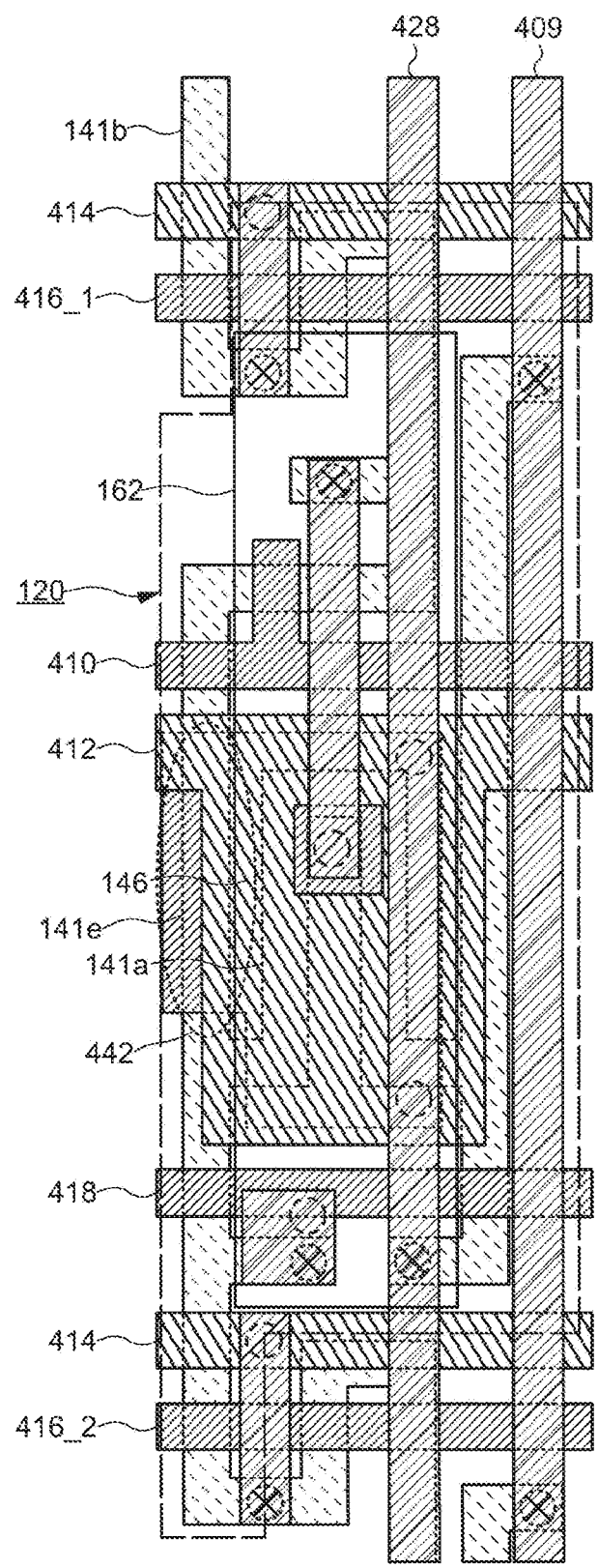
FIG. 31 is a schematic layout of a pixel included in a display device related to one embodiment of the present invention.

FIG. 31 is a schematic layout of pixels included in a display device according to one embodiment of the present invention. FIG. 31 is different from the layout shown in FIG. 4 in that the region where the semiconductor layer 141e and the gate electrode 146 overlap is the auxiliary capacitor element Csx. The rest of the structure is the same as in FIG. 4 and therefore an explanation is omitted.

Figure 32:
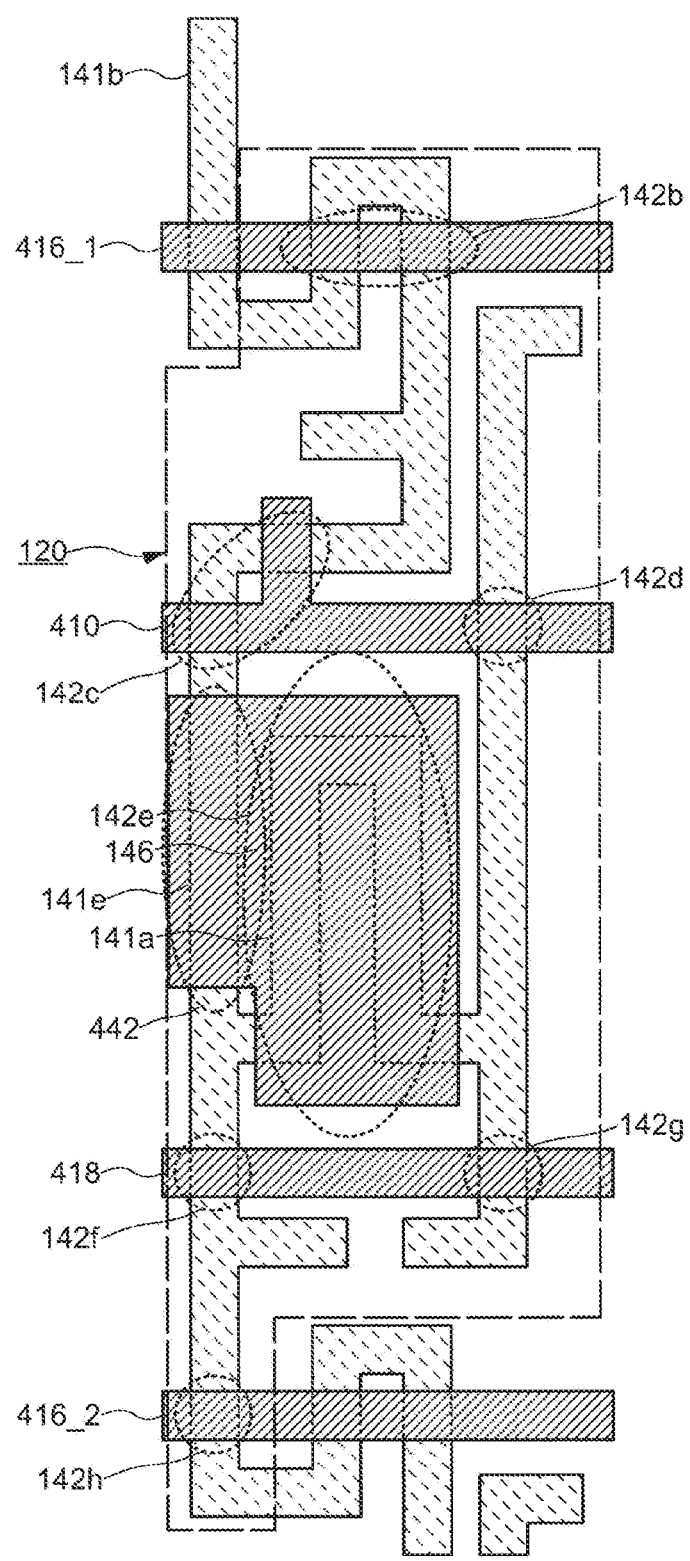
FIG. 32 is a part of a schematic layout of a pixel included in a display device related to one embodiment of the present invention.

FIG. 32 is a part of a schematic layout of pixels included in a display device according to one embodiment of the present invention. FIG. 32 is different from the layout shown in FIG. 8 in that the region where the semiconductor layer 141e and the gate electrode 146 overlap is the auxiliary capacitor element Csx (auxiliary capacitor element 442). Since the rest of the structure is the same as in FIG. 8, an explanation is omitted.

The auxiliary capacitor element Csx (auxiliary capacitor element 442) is formed by a semiconductor layer 141e, a gate electrode 146 and a gate insulating film 144 sandwiched between the gate electrode 146 and the semiconductor layer 141e. The semiconductor layer 141e has lower resistance than the semiconductor layer 141 in order to form the auxiliary capacitor element Csx. For example, impurities such as boron or phosphorus are injected in order to lower the resistance of the semiconductor layer 141e more than that of the semiconductor layer 141. Furthermore, the structural elements of the auxiliary capacitor element Csx are not limited to those described above. For example, the auxiliary capacitor element Csx may be formed by making the gate electrode 146 and the capacitor line 412 described above face each other interposed by an insulating film. In addition, the auxiliary capacitor element Csx may be formed by making the capacitor line 412 and a pixel electrode of a light emitting element OLED face each other interposed by an insulating film. Furthermore, as is shown in FIG. 32, the gate electrode 146 and the semiconductor layer 141e overlap each other.

The auxiliary capacitor element Csx is arranged between the node A(n) which is connected to the gate electrode of the drive transistor DRT and the node C(n) which is connected to the drain electrode of the drive transistor DRT. In the display device according to one embodiment of the present invention, it is possible to adjust the ratio between the amount of change of Vgs of the drive transistor DRT and the amplitude of the potential Vsig(m) of the image signal by arranging the auxiliary capacitor element Csx. Specifically, Vgs is as shown in equation 2 below. Here, Vgs is a potential between the gate electrode and the source electrode of the drive transistor DRT. Csv is a capacitance value of the storage capacitor element Cs. Csxv is a capacitance value of the auxiliary capacitor element Csx. Vsig(m) is a potential of an image signal. VDD_V is a potential of the drive power supply line PVDD. Vth is a threshold voltage of the drive transistor. V and is a potential of the first electrode (anode electrode) of the OLED when the light emitting element OLED emits light.

$$Vgs = \frac{Csv}{(Csv + Csxv)} \times (Vsig(m) - \text{VDD\_V}) - Vth + \frac{Csv}{(Csv + Csxv)} \times Vand \qquad (2)$$

The present embodiment is different from the first embodiment in that a region where the semiconductor layer 141e and the gate electrode 146 overlap is the auxiliary capacitor element Csx (auxiliary capacitor element 442). In addition, the present embodiment is different from the first embodiment in that the auxiliary capacitor element Csx (auxiliary capacitor element 442) is formed by the semiconductor layer 141e, the gate electrode 146, and the gate insulating film 144 sandwiched between the gate electrode 146 and the semiconductor layer 141e. The rest can be applied with the structure of the first embodiment. Furthermore, since the content is substantially the same as the content explained in the first embodiment, an explanation is omitted in the present embodiment.

By arranging the auxiliary capacitor element Csx in the display device according to one embodiment of the present invention, it is possible to increase the potential of the gate electrode of the drive transistor DRT by a voltage amount corresponding to the ratio Csv/(Csv+Csxv). Therefore, it is possible to compress Vgs of the drive transistor DRT with respect to the voltage of an image signal. Therefore, by arranging the display device in one embodiment of the present invention with the auxiliary capacitor element Cx, it is possible to make the dynamic range of an image signal wider than the dynamic range of Vgs of the drive transistor DRT. Therefore, the display device according to one embodiment of the present invention can suppress uneven luminosity due to variations in image signals.

4. Third Embodiment

In the present embodiment, a stacked structure of a display device according to one embodiment of the present invention is explained. Furthermore, an explanation of structures similar to those of the first embodiment and the second embodiment may be omitted.

Figure 33:
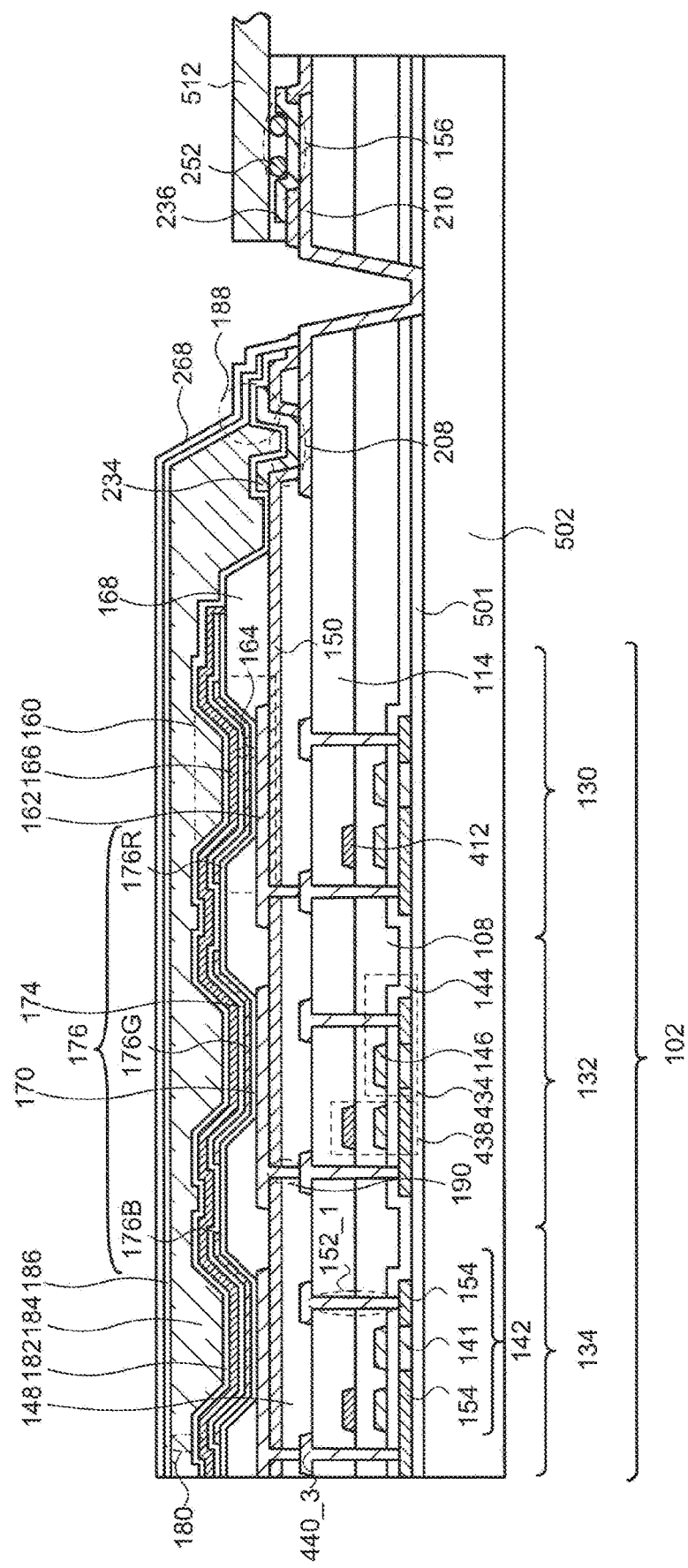
FIG. 33 is a schematic cross-sectional diagram of a display device related to one embodiment of the present invention.

FIG. 33 is a schematic cross-sectional diagram of a display device according to one embodiment of the present invention.

The display device 100 is arranged with a semiconductor layer 141 on the upper surface of a substrate 502 interposed by a base film 501 having an arbitrary structure.

A drive transistor 434 is arranged on the upper side of the base film 501. The drive transistor 434 includes a semiconductor layer 141, a gate insulating film 144, a gate electrode 146 and a source or drain electrode 154. The source electrode or drain electrode 154 and the auxiliary capacitor element (not shown in the diagram) may be formed by injecting impurities into the semiconductor layer 141. The gate electrode 146 overlaps the semiconductor layer 142 interposed by the gate insulating film 144. The region where the semiconductor layer 141 and the gate electrode 146 overlap is a channel region of the drive transistor 434. The semiconductor layer 142 may also have a source and drain region in order to sandwich the channel region. An insulating film 108 can be arranged above the gate electrode 146.

The transistor is shown as a top gate type transistor in FIG. 33. The structure of the drive transistor 434 is not limited. The structure of the drive transistor 434 may be, for example, a bottom gate type transistor, a multi-gate type transistor having a plurality of gate electrodes 146, or a dual gate type transistor having a structure in which the semiconductor layer 142 is sandwiched between two gate electrodes 146. In addition, an example is shown in FIG. 33 in which one pixel 102 has three sub-pixels, a sub-pixel 130, a sub-pixel 132 and a sub-pixel 134. In addition, an example is shown in FIG. 33 in which one drive transistor 434 is arranged for each sub-pixel 130, each sub-pixel 132 and each sub-pixel 134. Each sub-pixel 130, each sub-pixel 132 and each sub-pixel 134 may further include a semiconductor element such as a plurality of transistors or a capacitor element.

An insulating film 108 is arranged above the transistor. The insulating film 108 insulates the surface of a transistor and other semiconductor elements and also has a function of a dielectric of a capacitor element formed later. An inorganic insulating film such as a silicon oxide film, a silicon nitride film or a silicon oxynitride film can be used as the insulating film 108.

A capacitor line 412 is arranged above the insulating film 108. A reset potential line 414 is also arranged in the same layer as the capacitor line 412. Furthermore, the capacitor line 412 and the gate electrode 146 overlap.

Furthermore, an insulating film 114 is arranged. The insulating film 114 has a function for absorbing concave/convexities caused by a transistor and other semiconductor elements and also provides a flat surface. An organic compound material selected from acrylic, polyimide and the like which has excellent film surface flatness can be used as the insulating film 114. However, in the case where a capacitor element is formed between the capacitor line 412 and an upper layer conductive layer with the insulating film 114 as a dielectric using the capacitor line 412, an inorganic insulating film such as a silicon oxide film, a silicon nitride film or a silicon oxynitride film can be used for the insulating film 114 similar to the insulating film 108 described above.

An opening 152_1 which reaches the semiconductor layer 142 is arranged in the gate insulating film 144, the insulating film 108 and the insulating film 114. At the same time, an opening(not shown in the diagram) which reaches the gate electrode 146 is also arranged in the insulating film 108 and the insulating film 114. An opening(not shown in the diagram) which reaches the capacitor line 412 is also arranged in the insulating film 108 and the insulating film 114.

Next, an image signal line, a drive power source line and a conductive layer 440_3 arranged in the same layer as the image signal line are arranged. The conductive layer 440_3 is electrically connected to the semiconductor layer 142 or the source electrode or drain electrode 154 by the opening 152_1. The first terminal wiring 210 is also arranged in the same layer as an image signal line. Although not shown in the diagram, the first terminal line 210 may also be formed to exist within the same layer as the gate electrode 146.

Next, an insulating film 148 is arranged. The insulating film 148 has a function for absorbing concave/convexities caused by a transistor and other semiconductor elements, provides a flat surface and an organic compound material selected from acrylic or polyimide and the like which have excellent flat film surface properties can be used. In addition, an inorganic insulating film 150 may be formed above the insulating film 148. In addition, an electrode (not shown in the diagram) may be formed under the inorganic insulating film 150. At this time, a capacitor can be formed between the pixel electrode 162 and an electrode (not shown in the diagram) formed to sandwich the inorganic insulating film 150.

A plurality of openings are arranged in the insulating film 148 and the inorganic insulating film 150. One of the openings is the opening 190. The opening 190 electrically connects the pixel electrode 162 of the light emitting element 160 described later and wiring which is arranged in the same layer as the conductive layer 440_3 and the conductive layer 440_3. One of the openings is a contact hole 208 and is used for electrical connection between the first wiring 206 and the first terminal wiring 210. One of the openings is an opening 156 which is arranged to expose a part of the first terminal wiring 210. The first terminal wiring 210 which is exposed at the opening 156 is connected to the connector 512 by, for example, an anisotropic conductive film 252 or the like.

The light emitting element 160 is formed above the insulating film 114 and the inorganic insulating film 150. The light emitting element 160 includes a pixel electrode 162, a functional layer 164 and a common electrode 166. More specifically, the pixel electrode 162 is arranged to cover the opening 190 and to be electrically connected to the conductive layer 440_3. In this way, a current is supplied to the light emitting element 160 via the drive transistor DRT. An insulating film 168 is arranged to cover an end part of the pixel electrode 162. The insulating film 168 is a partition wall. By covering the end part of the pixel electrode 162 with the partition wall, it is possible to prevent disconnection of the functional layer 164 and the common electrode 166 arranged above. The functional layer 164 is arranged to cover the pixel electrode 162 and the partition wall, and the common electrode 166 is arranged above. Carriers are injected into the functional layer 164 from the pixel electrode 162 and the common electrode 166, and carrier recombination occurs in the functional layer 164. In this way, the light emitting molecules in the functional layer 164 enter an excited state, and light emission is obtained through a process of relaxation to a ground state. Therefore, a region where the pixel electrode 162 and the functional layer 164 contact each other is a light emitting region in each of the sub-pixel 130, each sub-pixel 132 and each sub-pixel 134.

The structure of the functional layer 164 can be appropriately selected and can be formed by combining, for example, a carrier injection layer, a carrier transport layer, a light emitting layer, a carrier blocking layer and an exciton blocking layer. An example is shown in FIG. 33 in which the functional layer 164 has three layers, a layer 170, a layer 176 and a layer 174. In this case, for example, layer 170 can be a carrier (hole) injection and transport layer, layer 176 can be a light emitting layer, and layer 174 can be a carrier (electron) injection and transport layer. The layer 176 which is a light emitting layer can be formed to include different materials for the sub-pixel 130, each sub-pixel 132 and each sub-pixel 134. In this case, the other layer 170 or layer 174 may be formed above the sub-pixel 130, each sub-pixel 132, each sub-pixel 134 and the partition wall so as to be shared by the sub-pixel 130, each sub-pixel 132 and each sub-pixel 134. By appropriately selecting the material used for the layer 176, it is possible to obtain different light emitting colors for the sub-pixel 130, each sub-pixel 132 and each sub-pixel 134. Alternatively, the structure of the layer 174 may be the same between the sub-pixel 130, each sub-pixel 132 and each sub-pixel 134. In this case, the layer 174 may also be formed above the sub-pixel 130, each sub-pixel 132, each sub-pixel 134 and the partition wall so as to be shared by the sub-pixel 130, each sub-pixel 132 and each sub-pixel 134. In this type of structure, since the same light emitting color is output from the layer 176 of each sub-pixel 130, each sub-pixel 132 and each subpixel 134, for example, the layer 176 can be formed to emit white light, and various colors (for example, red, green and blue) may be extracted from the sub-pixel 130, each sub-pixel 132 and each sub-pixel 134 respectively.

Furthermore, the display device 100 may further include connection electrodes 234 and 236 which cover the contact hole 208 and the opening 156 and contact the first terminal wiring 210. The connection electrodes 234, 236 can exist in the same layer as the pixel electrode 162. By forming the connection electrodes 234 and 236, it is possible to reduce damage to the first terminal wiring 210 in the manufacturing process of the display device 100, and it is possible to realize an electrical connection with low contact resistance.

A sealing film (passivation film) 180 is arranged above the light emitting element 160. The sealing film 180 has a function for preventing impurities (water, oxygen or the like) from entering the light emitting element 160 and a transistor from the exterior. As is shown in FIG. 33, the sealing film 180 can include three layers 182, 184 and 186. An inorganic film containing an inorganic compound can be used for the layer (first inorganic film) 182 and the layer (second inorganic film) 186. On the other hand, a film (organic film) containing an organic compound selected from acrylic or polyimide and the like can be used for the layer 184 between the first inorganic film 182 and the second inorganic film 186. The organic film 184 can be formed so as to absorb concave/convexities caused by the light emitting element 160 and a partition wall and to provide a flat surface. Therefore, the thickness of the organic film 184 can be made relatively large.

Furthermore, it is preferred that the first inorganic film 182 and the second inorganic film 186 are formed to cover at least the display region 504. In addition, the first inorganic film 182 and the second inorganic film 186 are preferred to be formed to not overlap the contact hole 208 and the opening 156. In this way, an electrical connection with low contact resistance between the first terminal wiring 210 and the connector 512 or the first wiring 206 is possible. Furthermore, it is preferred that the first inorganic film 182 and the second inorganic film 186 are in direct contact with each other in the periphery of the display region 504 (see the region surrounded by the circle 188). In this way, since it is possible to seal the organic film 184 having high hydrophilicity with the first inorganic film 182 and the second inorganic film 186 compared with the first inorganic film 182 and the second inorganic film 186, It is possible to more effectively prevent impurities from entering from the exterior and prevent diffusion of impurities into the display region 504.

A cover film 268 is arranged above the second inorganic film 186. The first terminal wiring 210 is arranged to contact a region (region A) which exposes the insulating film 114, the insulating film 108, the gate insulating film 144 and the base film 501, and contact the substrate 502. The region A is a region in which the display device 100 can be bent. The cover film 268 protects the surface of the display device 100 up to the region which can be bent. In addition, a cover film 269 may also be arranged under the base film 501. The cover film 269 protects the base film 501 from being damaged and also protects the rear surface of the display device 100. Furthermore, the cover film 268 and the cover film 269 are not essential and the cover film 268 itself may extend to a region which can be bent as long as the cover film 268 is sufficiently flexible with respect to bending.

The display device according to one embodiment of the present invention can be provided with the stacked structure described above. By providing the display device according to one embodiment of the present invention with the stacked structure described above, it is possible to widen the dynamic range of an image signal more than the dynamic range of Vgs of the drive transistor DRT. Therefore, the display device according to one embodiment of the present invention can suppress uneven luminosity due to variations in image signals.

Each embodiment described above as embodiments of the present invention can be implemented in combination as appropriate as long as they do not contradict each other. In addition, those skilled in the art could appropriately add, delete or change the design of the constituent elements based on the display device of each embodiment, or add, omit or change conditions as long as it does not depart from the concept of the present invention and such changes are included within the scope of the present invention.

An EL display device is exemplified as a disclosure example in the present specification. The size of the display device can be applied from a medium to small size to a large size without any particular limitation.

Even if other actions and effects different from the actions and effects brought about by the aspects of each embodiment described above are obvious from the description of the present specification or those which could be easily predicted by those skilled in the art, such actions and effects are to be interpreted as being provided by the present invention.

What is claimed is:

1. A display device comprising:
   a drive transistor;
   a first capacitor element with a pair of electrodes;
   a first switch;
   a light emitting element;
   a third switch;
   a fourth switch;
   a fifth switch;
   a sixth switch; and
   a power supply line,
   wherein
   the drive transistor has a first electrode connected to a first node, a second electrode connected to a second node, and a third electrode connected to a third node;
   the first electrode is a gate electrode,
   the second electrode is one of a source electrode and a drain electrode,
   the third electrode is an other of the source electrode and the drain electrode,
   one of the pair of electrodes is formed from a first conductive layer arranged in the same layer as the first electrode of the drive transistor, and is connected to the first node,
   an other of the pair of electrodes is formed from a semiconductor layer arranged in the same layer as an active layer of the drive transistor, and is connected to the second node,
   the first switch is connected between the first node and the third node,
   the light emitting element includes a pixel electrode electrically connected to the third node, and a first common electrode,
   a second capacitor element connected between a second common electrode and the first node is included,
   the pixel includes a second switch having one terminal connected to an image signal line and another terminal connected to the second node,
   the third switch is electrically connected between a third common electrode and the first node,
   the fourth switch is electrically connected between the power supply line and the second node,
   the fifth switch is electrically connected between the third node and the pixel electrode,
   the sixth switch is electrically connected between the third common electrode and the pixel electrode,
   a capacitance value of the first capacitor element is smaller than a capacitance value of the second capacitor element, and
   a potential of the first common electrode is smaller than a potential of the second common electrode.

2. The display device according to claim 1, wherein the first conductive layer overlaps the semiconductor layer.

3. The display device according to claim 1, wherein the capacitance value of the first capacitor element is 30% or more and 50% or less than the capacitance value of the second capacitor element.

4. The display device according to claim 1, wherein a potential of the second common electrode is substantially same as a potential of the power supply line.

5. The display device according to claim 1, wherein when the first switch, the drive transistor and the second switch are conducting, a charge corresponding to a threshold voltage of the drive transistor is stored between one electrode and the other electrode of the first capacitor element, and a potential of the first node increases by a ratio calculated from the capacitance value of the first capacitor element and the capacitance value of the second element when the light emitting element emits light compared to when the light emitting element does not emit light.

6. The display device according to claim 1, wherein a potential of the third common electrode is smaller than a potential of the power supply line and a potential of the second common electrode.

7. The display device according to claim 1, wherein a second conductive layer forming the third common electrode overlaps both the first conductive layer and the semiconductor layer.

8. A display device having a plurality of pixels, each of the plurality of pixels comprising:
   a drive transistor;
   a first capacitor element with a pair of electrodes;
   a first switch; and
   a light emitting element;
   a third switch;
   a fourth switch;
   a fifth switch;
   a sixth switch; and
   a power supply line,
   wherein
   the drive transistor has a first electrode connected to a first node, a second electrode connected to a second node, and a third electrode connected to a third node;
   the first electrode is a gate electrode,
   the second electrode is one of a source electrode and a drain electrode, the third electrode is an other of the source electrode and the drain electrode, one of the pair of electrodes is formed from a first conductive layer arranged in the same layer as the first electrode of the drive transistor, and is connected to the first node, an other of the pair of electrodes is formed from a semiconductor layer arranged in the same layer as an active layer of the drive transistor, and is connected to the third node, the first switch is connected between the first node and the third node, the light emitting element includes a pixel electrode electrically connected to the third node, and a first common electrode, a second capacitor element connected between a second common electrode and the first node is included, the pixel includes a second switch having one terminal connected to an image signal line and another terminal connected to the second node, the third switch is electrically connected between a third common electrode and the first node, the fourth switch is electrically connected between the power supply line and the second node, the fifth switch is electrically connected between the third node and the pixel electrode, the sixth switch is electrically connected between the third common electrode and the pixel electrode, a capacitance value of the first capacitor element is smaller than a capacitance value of the second capacitor element, and a potential of the first common electrode is smaller than a potential of the second common electrode.

9. The display device according to claim 8, wherein the capacitance value of the first capacitor element is 30% or more and 50% or less than the capacitance value of the second capacitor element.

10. The display device according to claim 8, wherein when the first switch, the drive transistor and the second switch are conducting, a charge corresponding to a threshold voltage of the drive transistor is stored between one electrode and the other electrode of the first capacitor element, and a potential of the first node increases by a ratio calculated from the capacitance value of the first capacitor element and the capacitance value of the second element when the light emitting element emits light compared to when the light emitting element does not emit light.

11. A display device comprising:

a drive transistor;

a first capacitor element with a pair of electrodes;

a first switch; and a light emitting element, wherein the drive transistor has a first electrode connected to a first node, a second electrode connected to a second node, and a third electrode connected to a third node;

the first electrode is a gate electrode, the second electrode is one of a source electrode and a drain electrode, the third electrode is an other of the source electrode and the drain electrode, one of the pair of electrodes is formed from a first conductive layer arranged in the same layer as the first electrode of the drive transistor, and is connected to the first node, an other of the pair of electrodes is formed from a semiconductor layer arranged in the same layer as an active layer of the drive transistor, and is connected to the second node, the first switch is connected between the first node and the third node, the light emitting element includes a pixel electrode electrically connected to the third node, and a first common electrode, a second capacitor element connected between a second common electrode and the first node is included, a capacitance value of the first capacitor element is smaller than a capacitance value of the second capacitor element, and when the first switch, the drive transistor and the second switch are conducting, a charge corresponding to a threshold voltage of the drive transistor is stored between one electrode and the other electrode of the first capacitor element, and a potential of the first node increases by a ratio calculated from the capacitance value of the first capacitor element and the capacitance value of the second element when the light emitting element emits light compared to when the light emitting element does not emit light.

12. The display device according to claim 11, wherein a potential of the first common electrode is smaller than a potential of the second common electrode.

* * * * *